(12) United States Patent
Shigihara et al.

(10) Patent No.: US 6,606,334 B1
(45) Date of Patent: Aug. 12, 2003

(54) SEMICONDUCTOR LASER

(75) Inventors: Kimio Shigihara, Tokyo (JP); Kazushige Kawasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 187 days.

(21) Appl. No.: 09/710,891

(22) Filed: Nov. 14, 2000

(30) Foreign Application Priority Data

Nov. 17, 1999 (JP) ............................................ 11-326781
Aug. 28, 2000 (JP) ........................................ 2000-257436

(51) Int. Cl.[7] .............................. H01S 5/00; H01S 5/065
(52) U.S. Cl. ............................... 372/45; 372/46; 372/43
(58) Field of Search ..................................... 372/43–50

(56) References Cited

U.S. PATENT DOCUMENTS

| | | | | |
|---|---|---|---|---|
| 4,982,409 A | * | 1/1991 | Kinoshita et al. | 372/45 |
| 5,210,767 A | * | 5/1993 | Arimoto et al. | 372/46 |
| 5,592,502 A | * | 1/1997 | Matsumoto et al. | 372/45 |
| 6,118,799 A | * | 9/2000 | Okubo et al. | 372/46 |
| 6,195,375 B1 | * | 2/2001 | Hirata | 372/46 |
| 6,285,694 B1 | | 9/2001 | Shigihara | |

FOREIGN PATENT DOCUMENTS

| JP | 5-251813 | 9/1993 |
|---|---|---|
| JP | 8-228042 | 9/1996 |

OTHER PUBLICATIONS

Hashimoto, Tadao et al., "Reduction of Beam Divergence Angle by Low–Refractive–Index Layers Introduced to Real–Refractive–Index–Guided GaAlAs High–Power Laser Diodes", Jpn. J. Appl. Phys., vol. 36 (1997), pp. 2676–2680, Part 1, No. 5A, May 1997.

Eliscev, P. G. et al., "Analysis of the Mode Internal Coupling in InGaAs/GaAs Laser Diodes", Laser Physics, vol. 4, No. 3, 1994, pp. 485–492.

Hashimoto et al., "Reduction Of Beam Divergence Angle By Low–Refractive–Index Layers Introduced To Real–Refractive–Index–Guided GaAlAs High–Power Laser Diodes", Japanese Journal of Applied Physics, vol. 37, Part 1, No. 5A, May 1997, pp. 2676–2680.

* cited by examiner

*Primary Examiner*—Nathan J. Flynn
*Assistant Examiner*—Johannes P Mondt
(74) *Attorney, Agent, or Firm*—Leydig, Voit & Mayer, Ltd.

(57) ABSTRACT

A semiconductor laser that has a large laser light aspect ratio, a high kink level, and a small variation in optical output efficiency. A semiconductor laser in which an increase in threshold current and a reduction in the optical output efficiency at an elevated temperature are prevented. The semiconductor laser includes a low refractive index layer between a guide layer and a cladding layer, and the total layer thickness of an active layer and the guide layer is not less than about 15% of an oscillation wavelength.

20 Claims, 26 Drawing Sheets

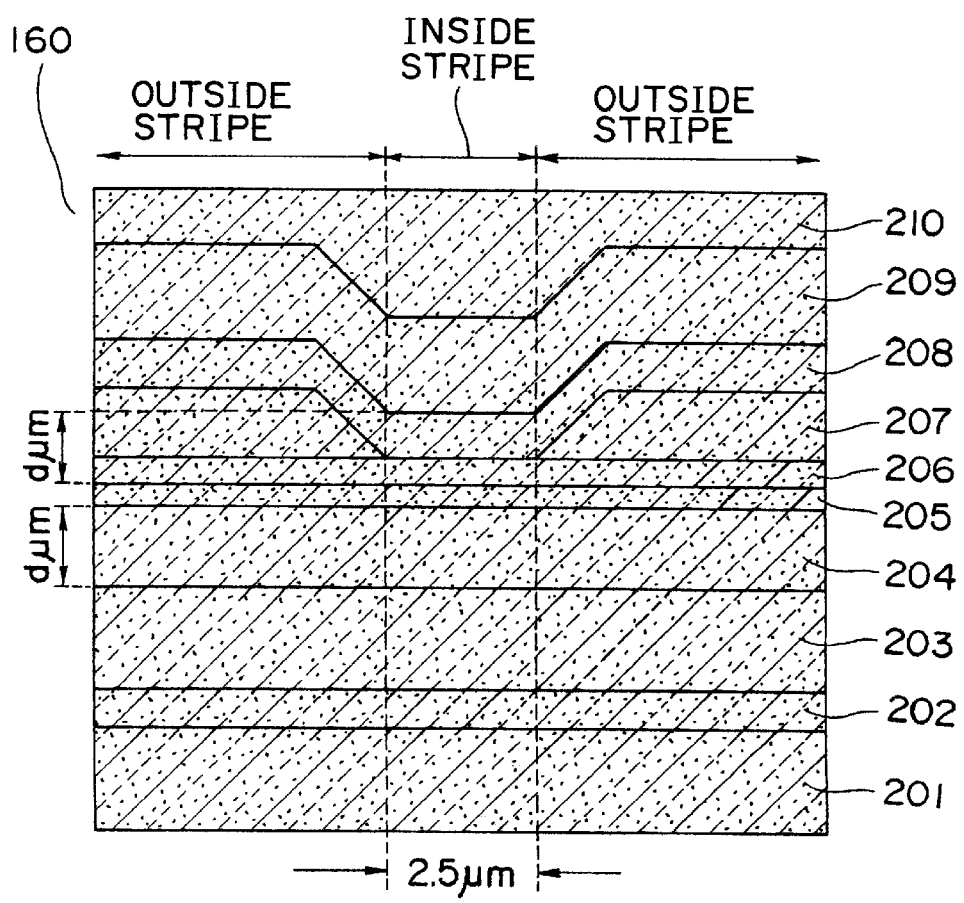

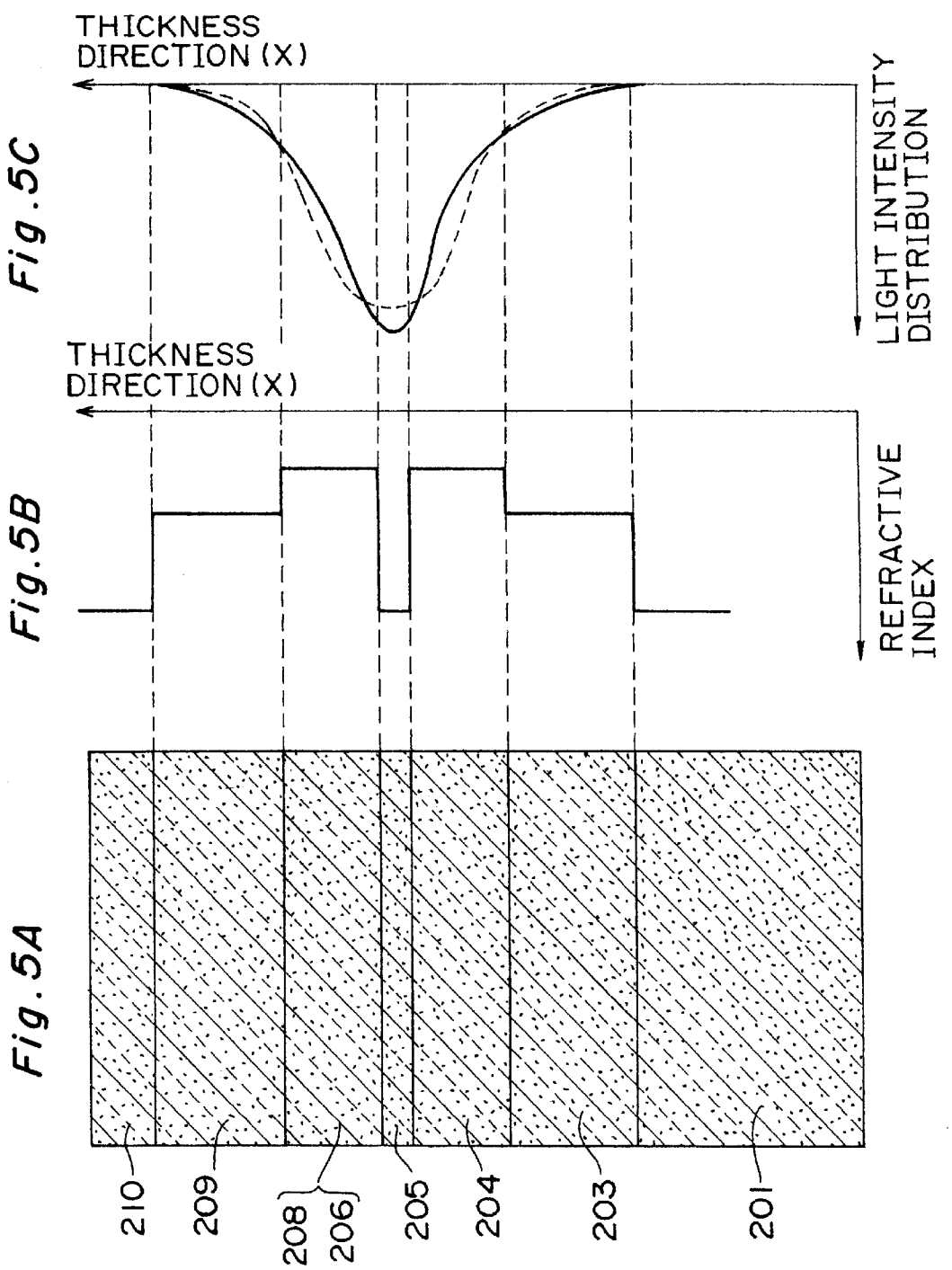

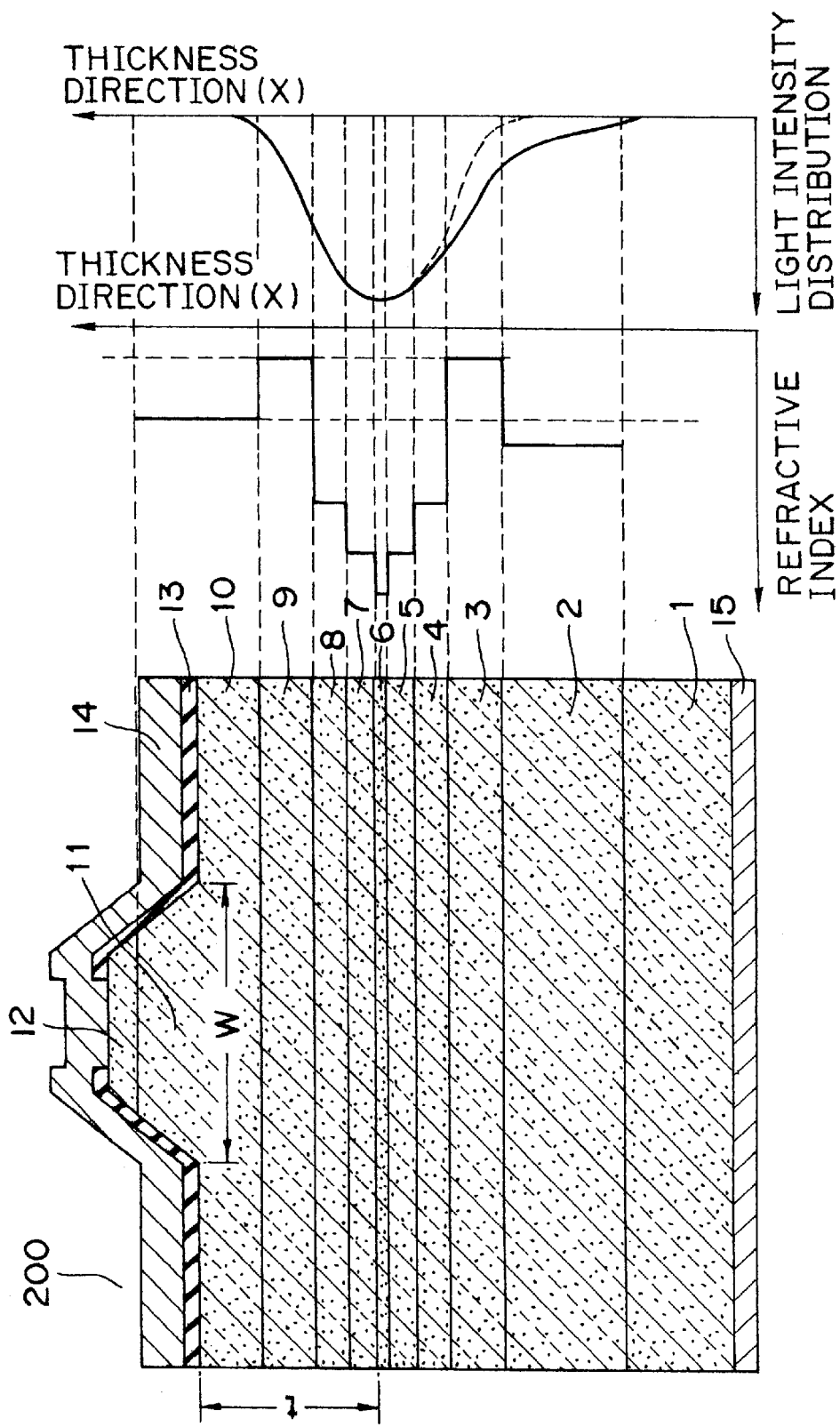

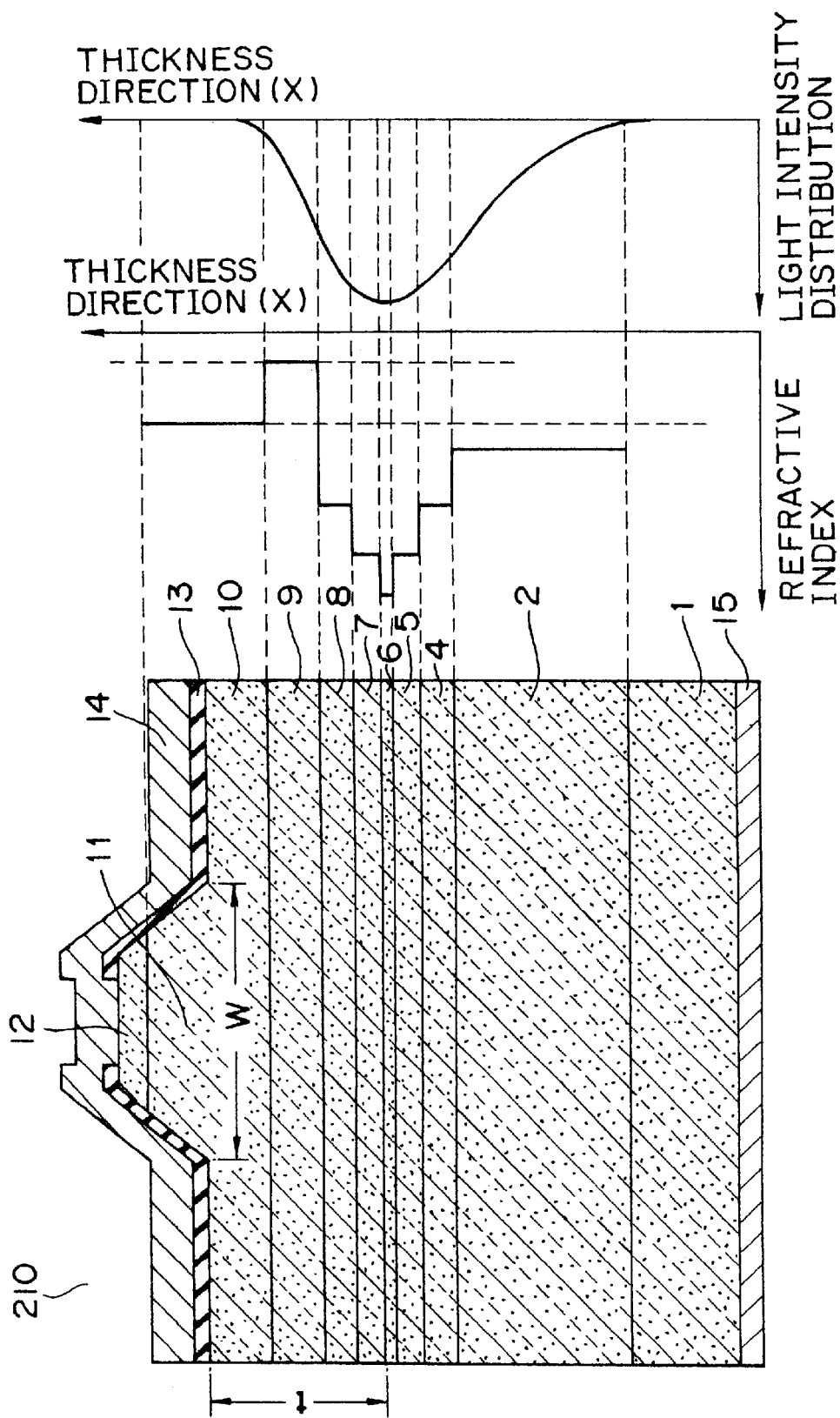

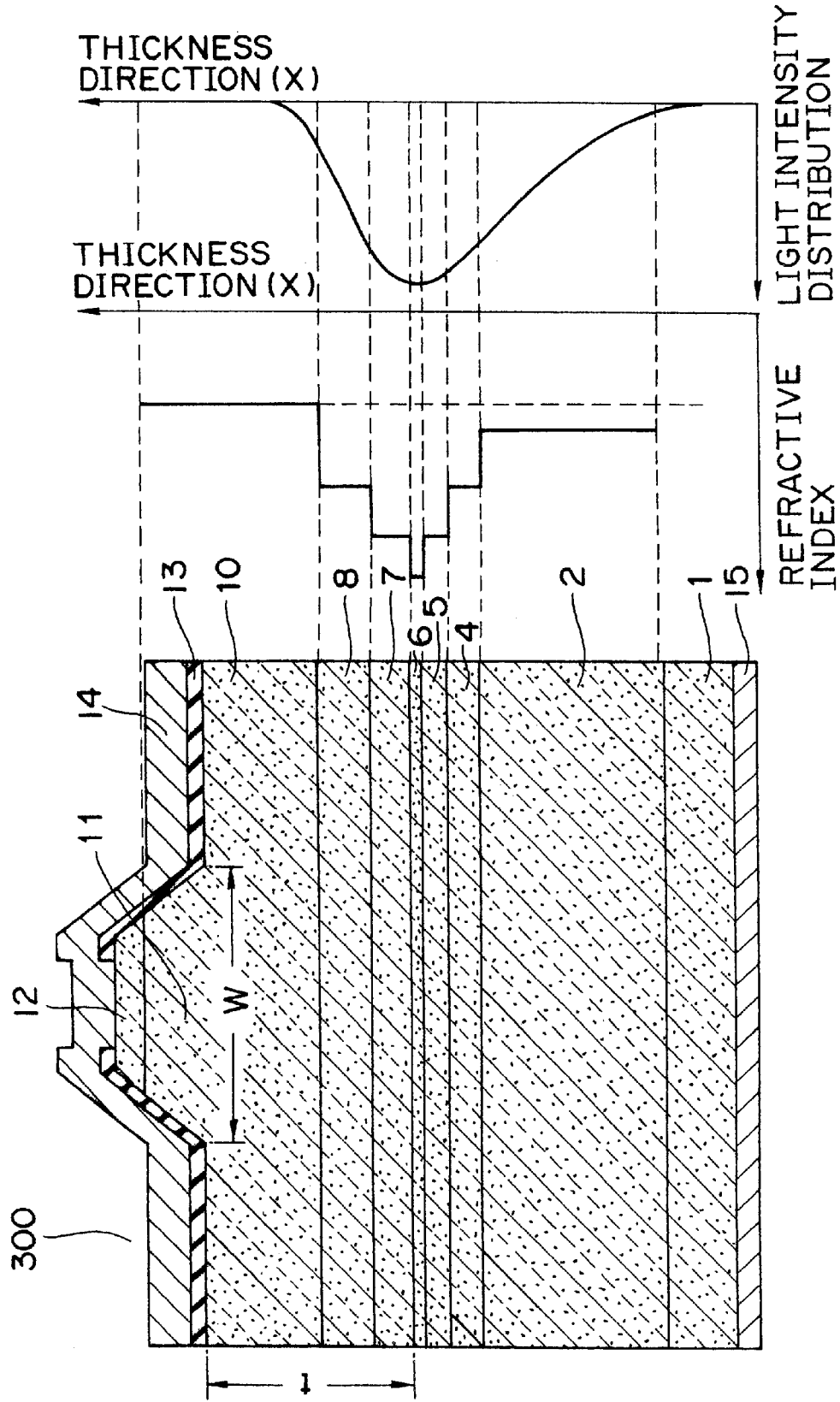

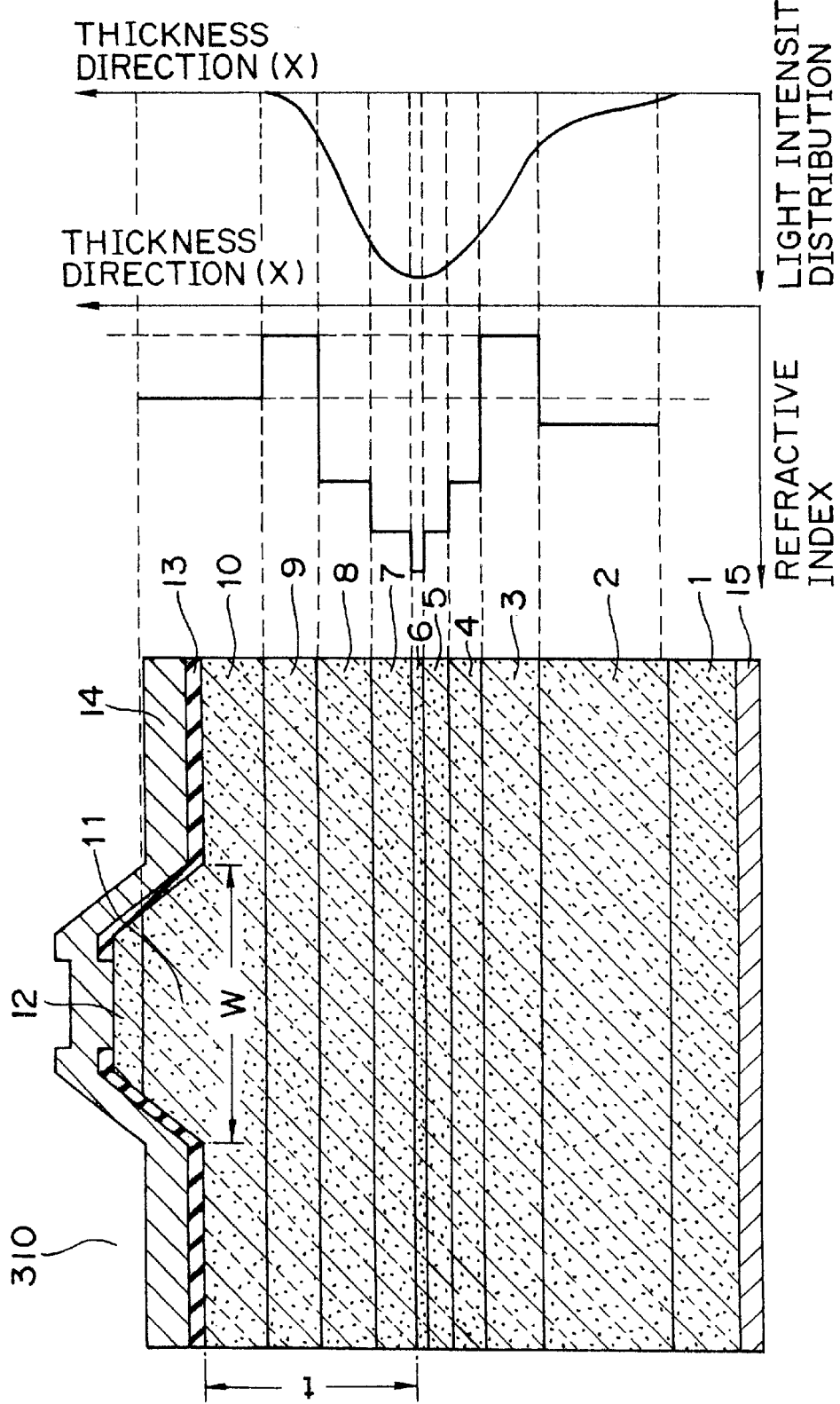

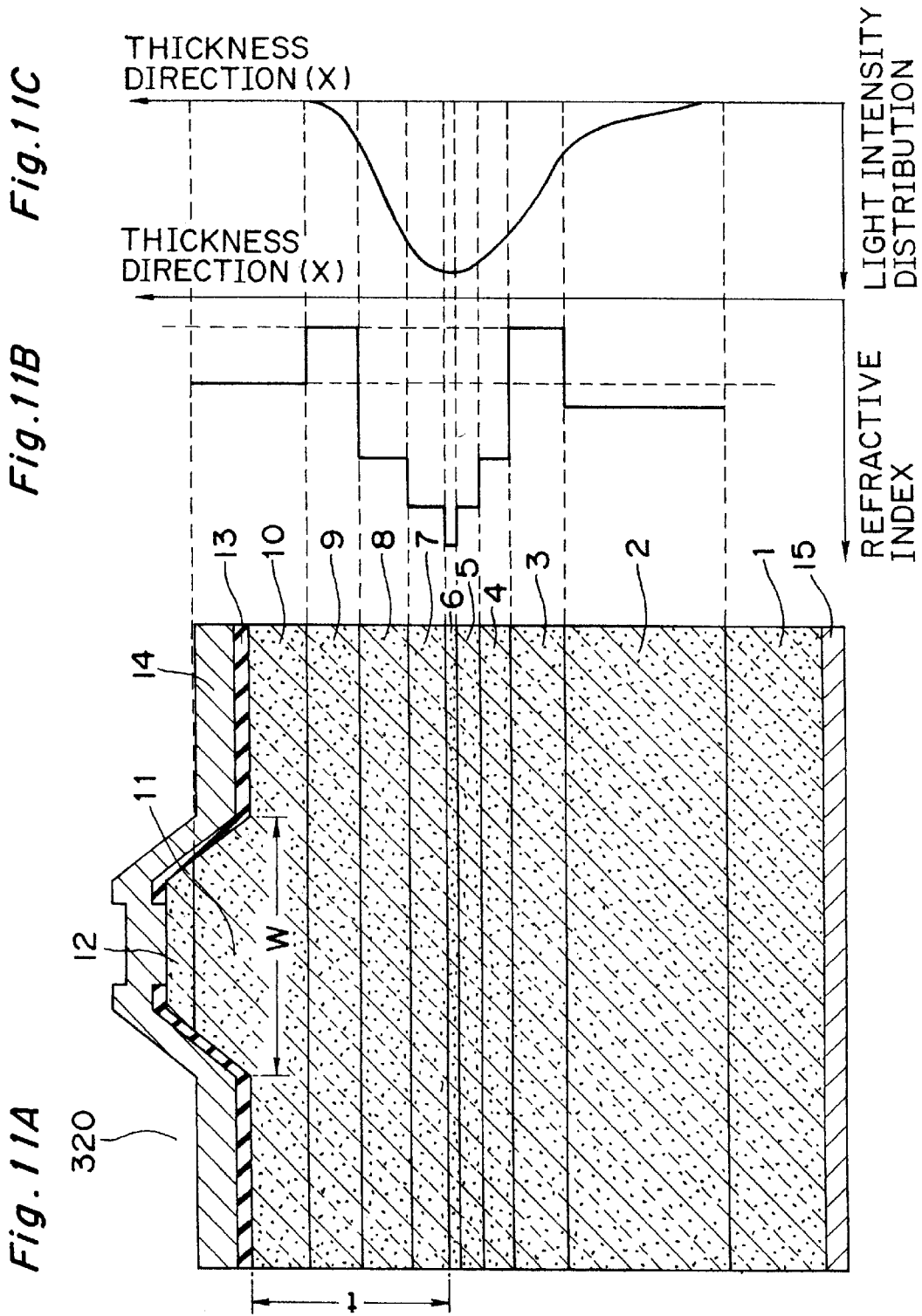

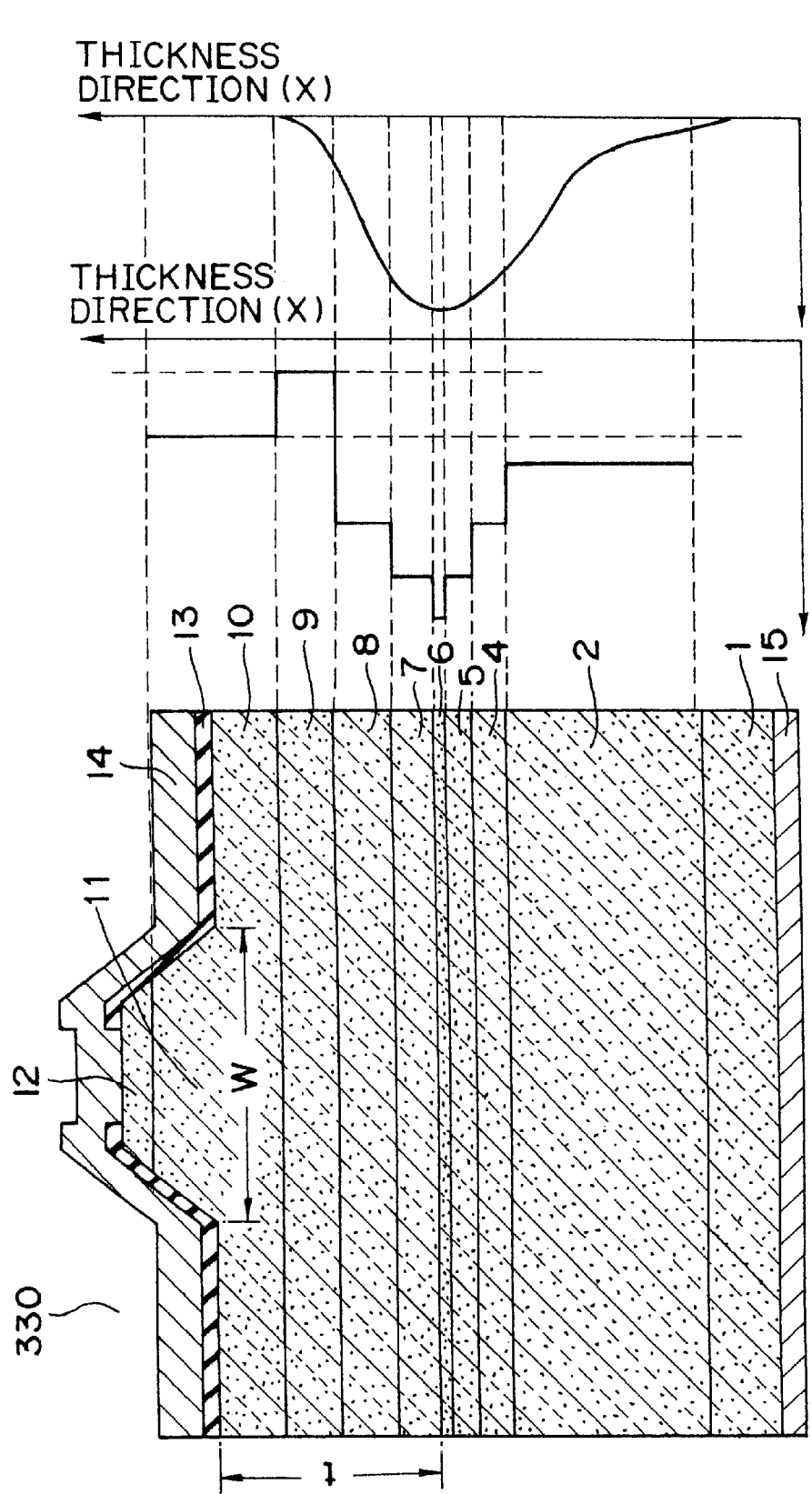

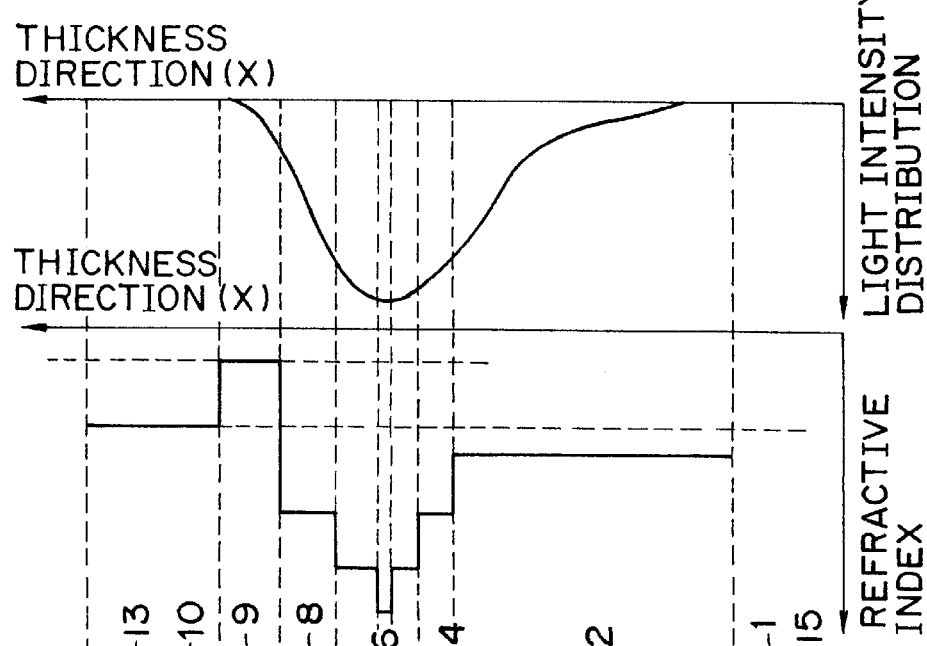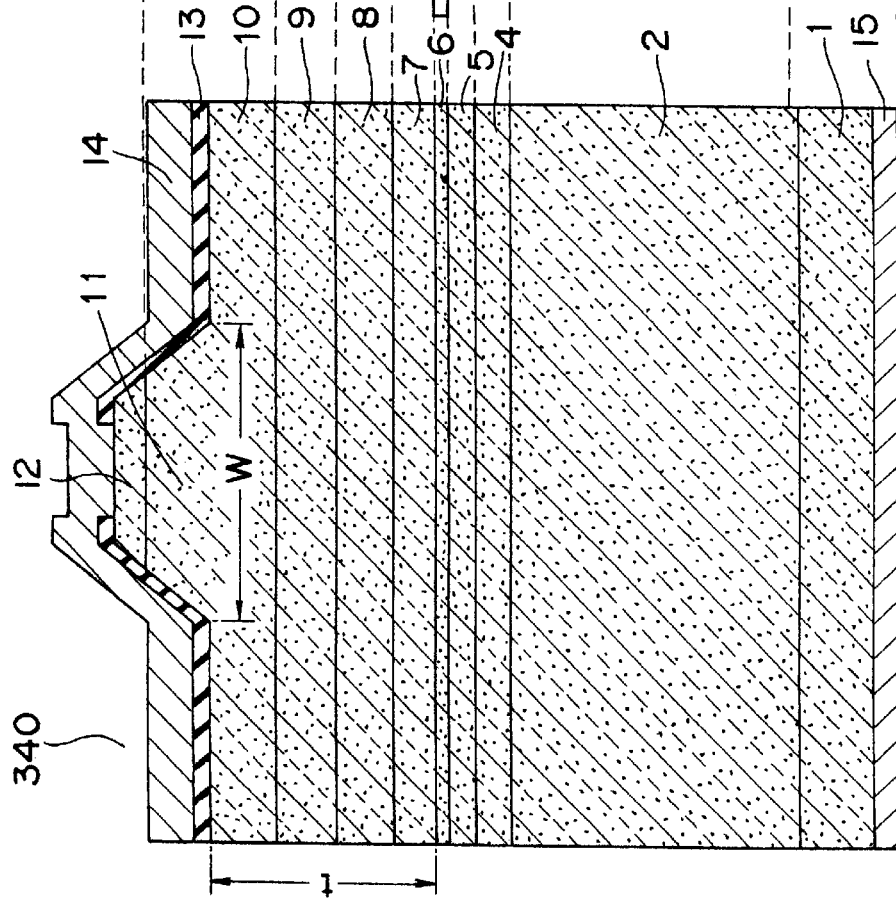

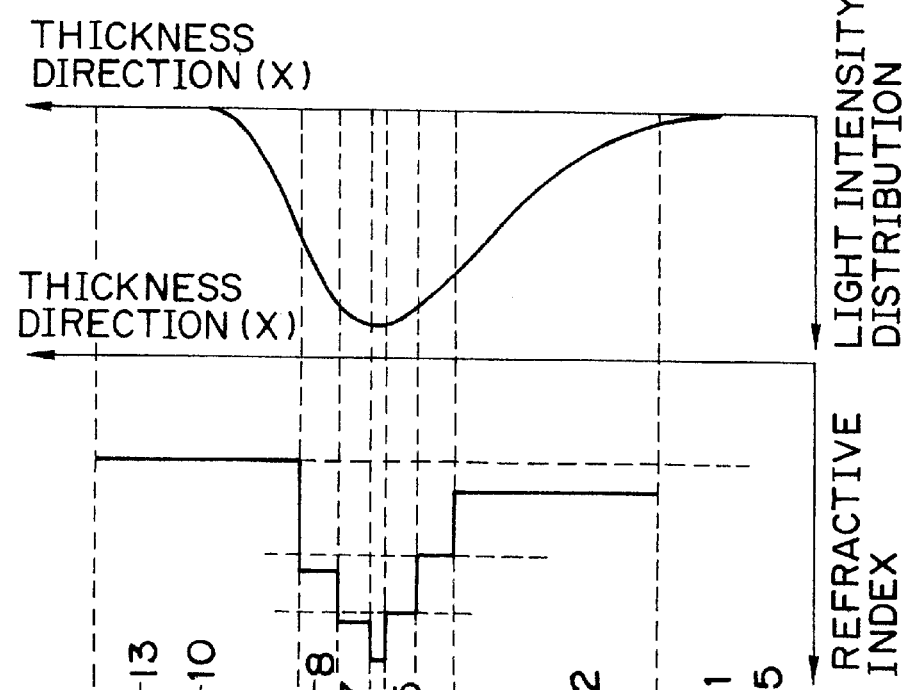
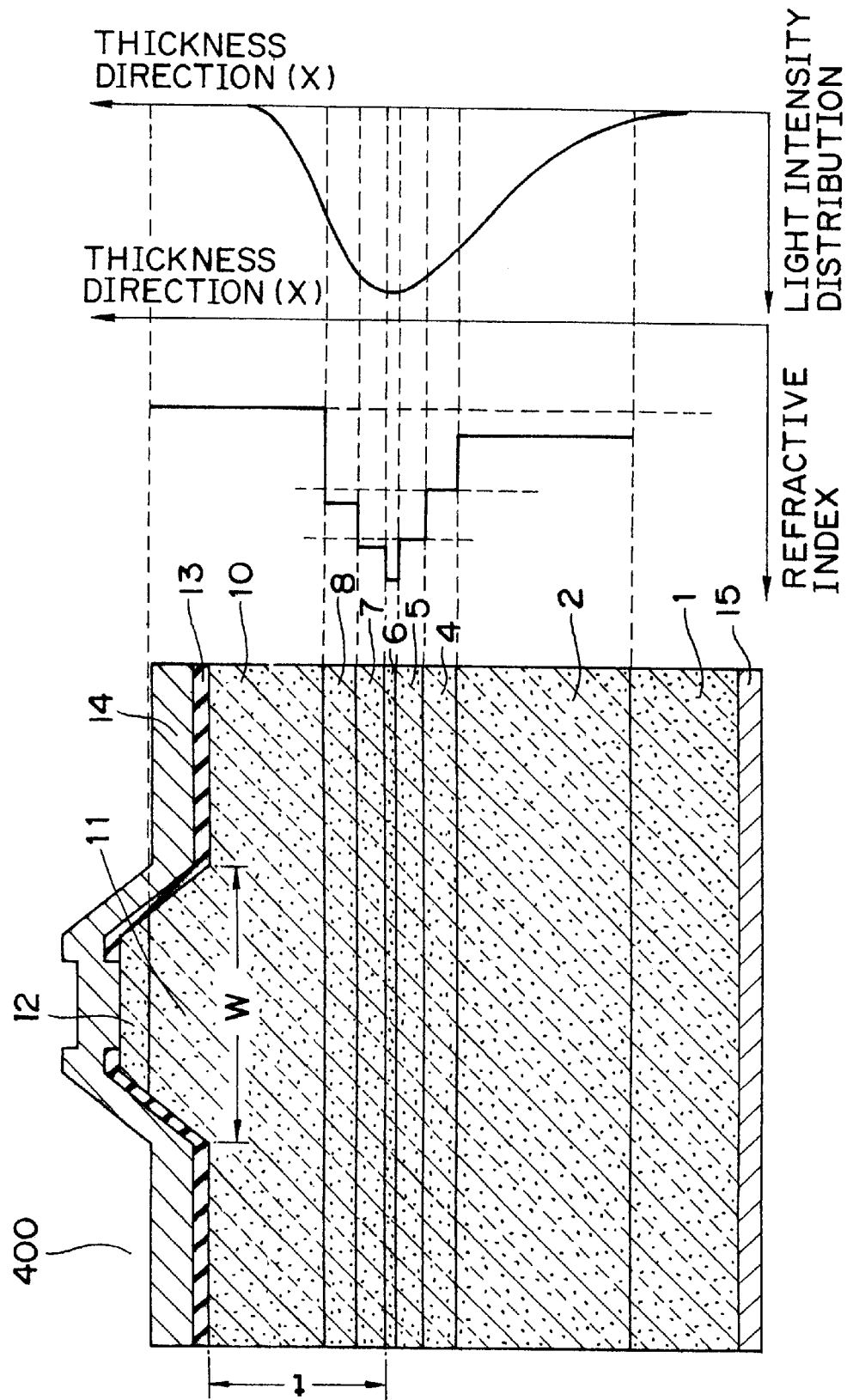

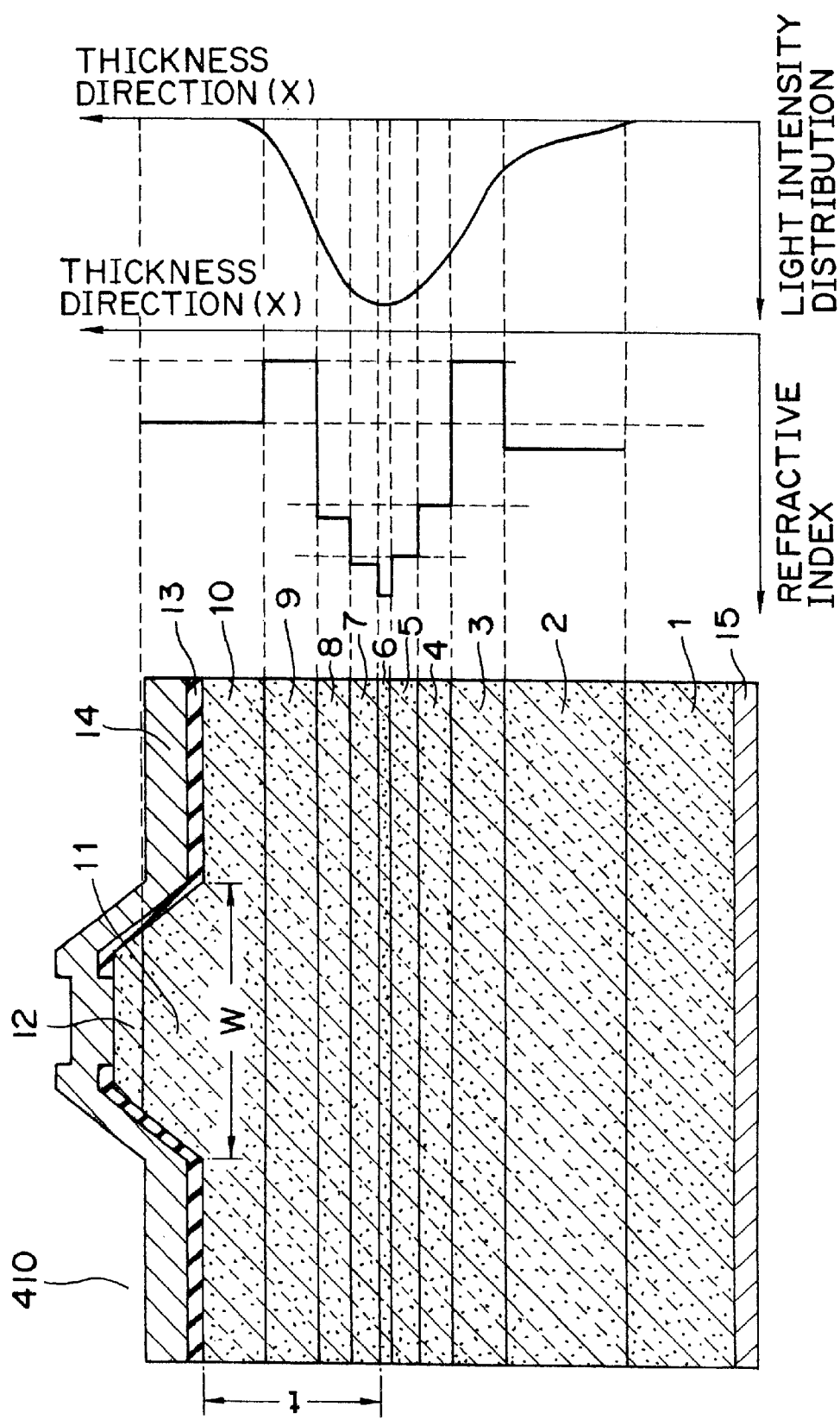

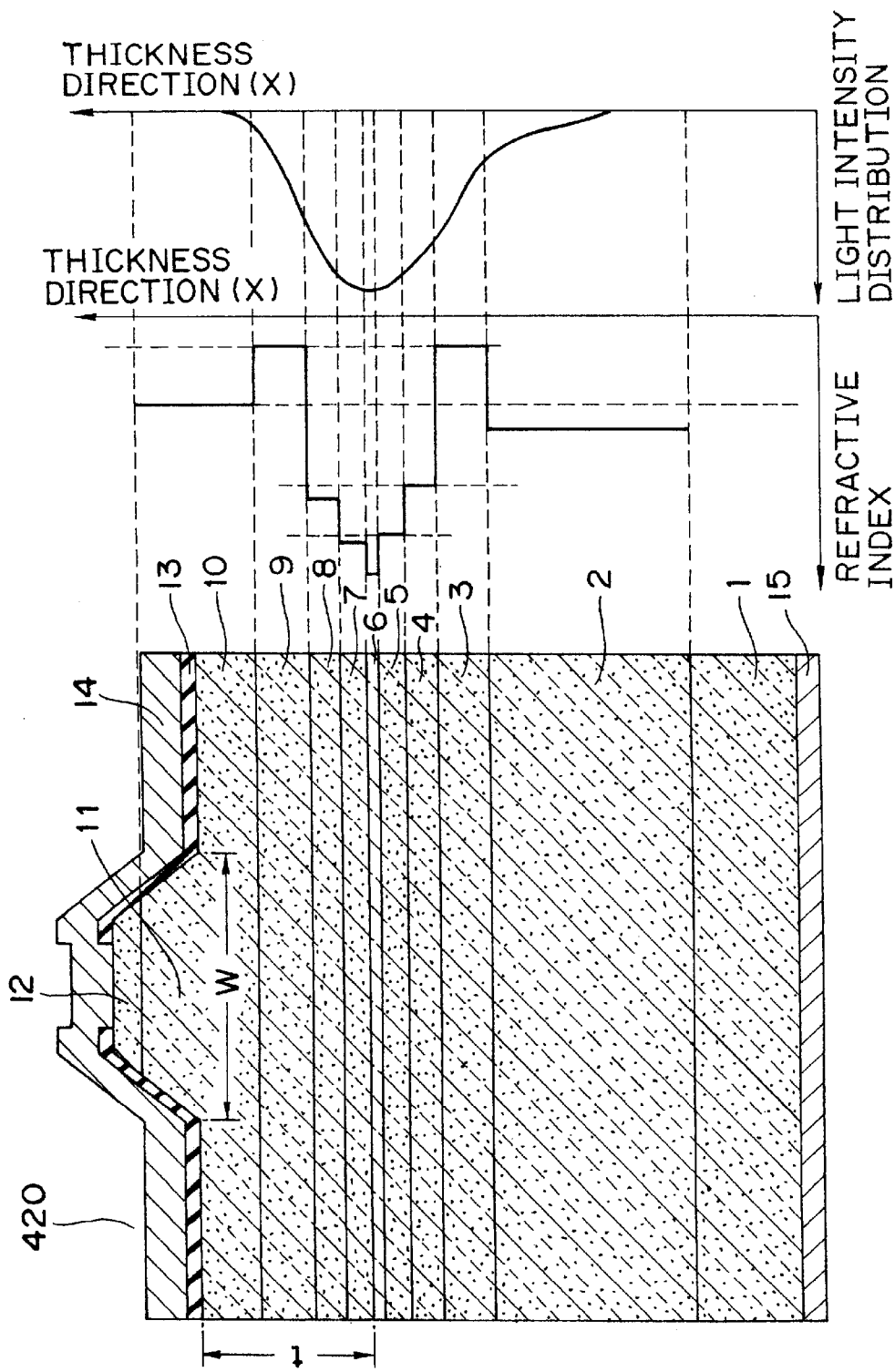

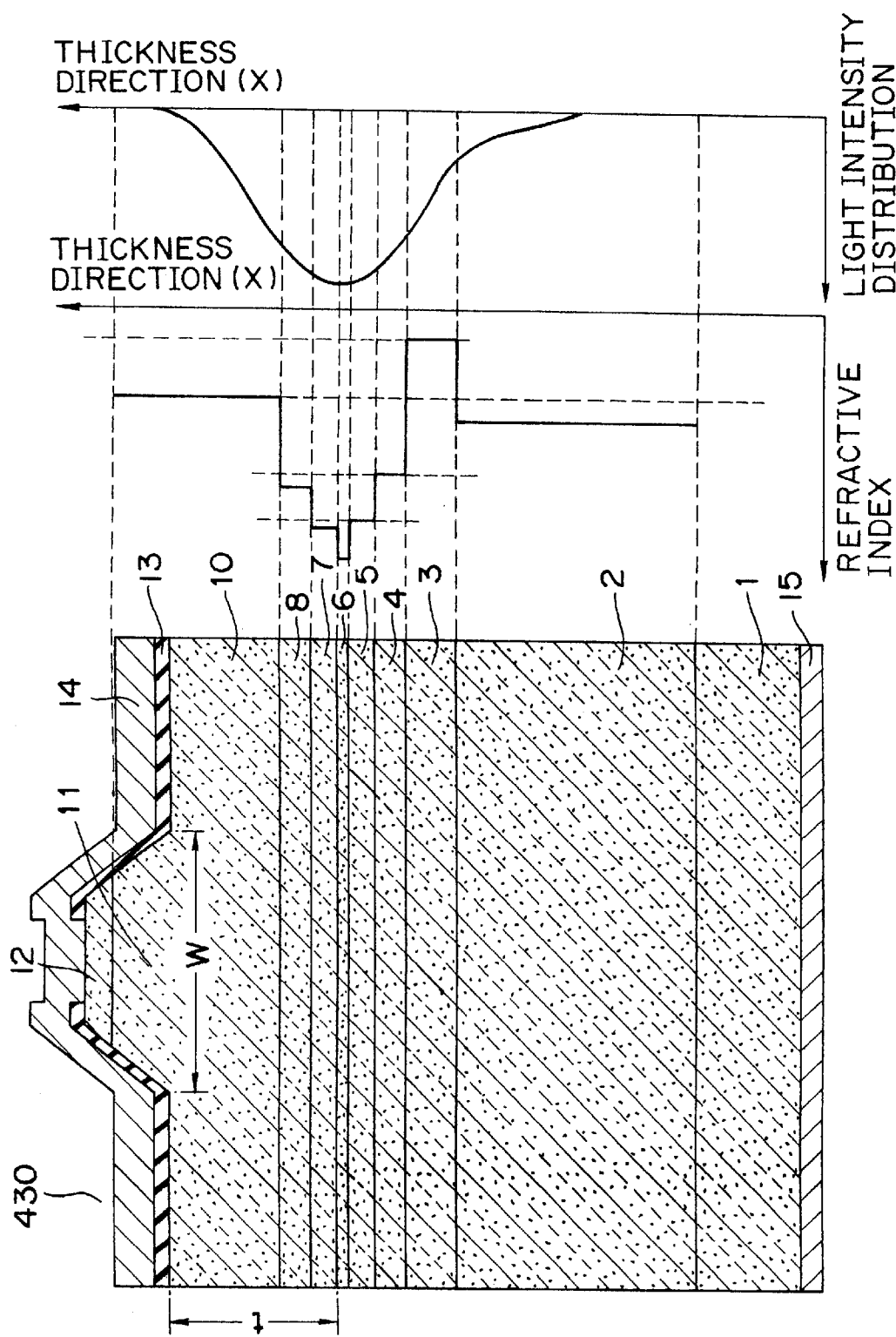

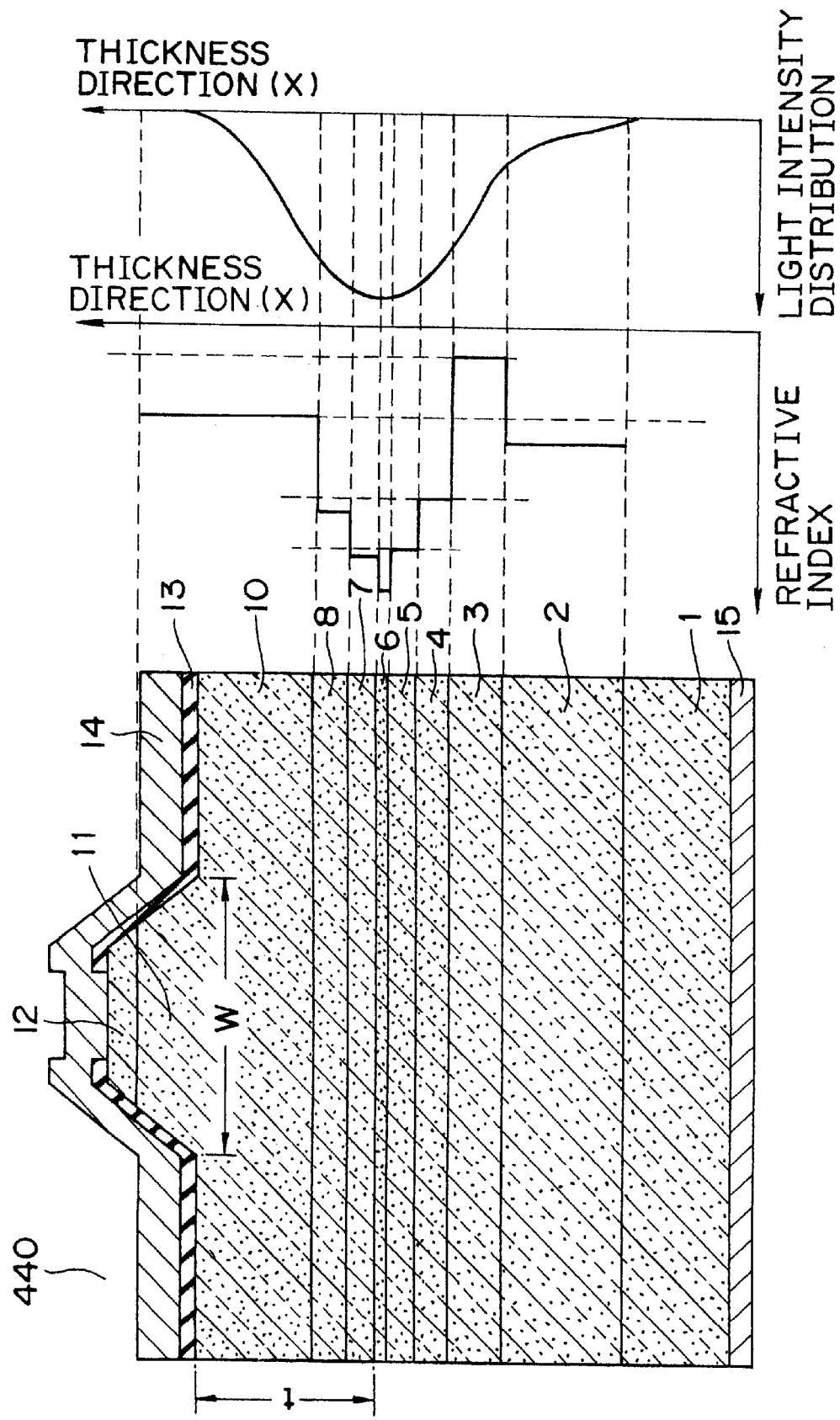

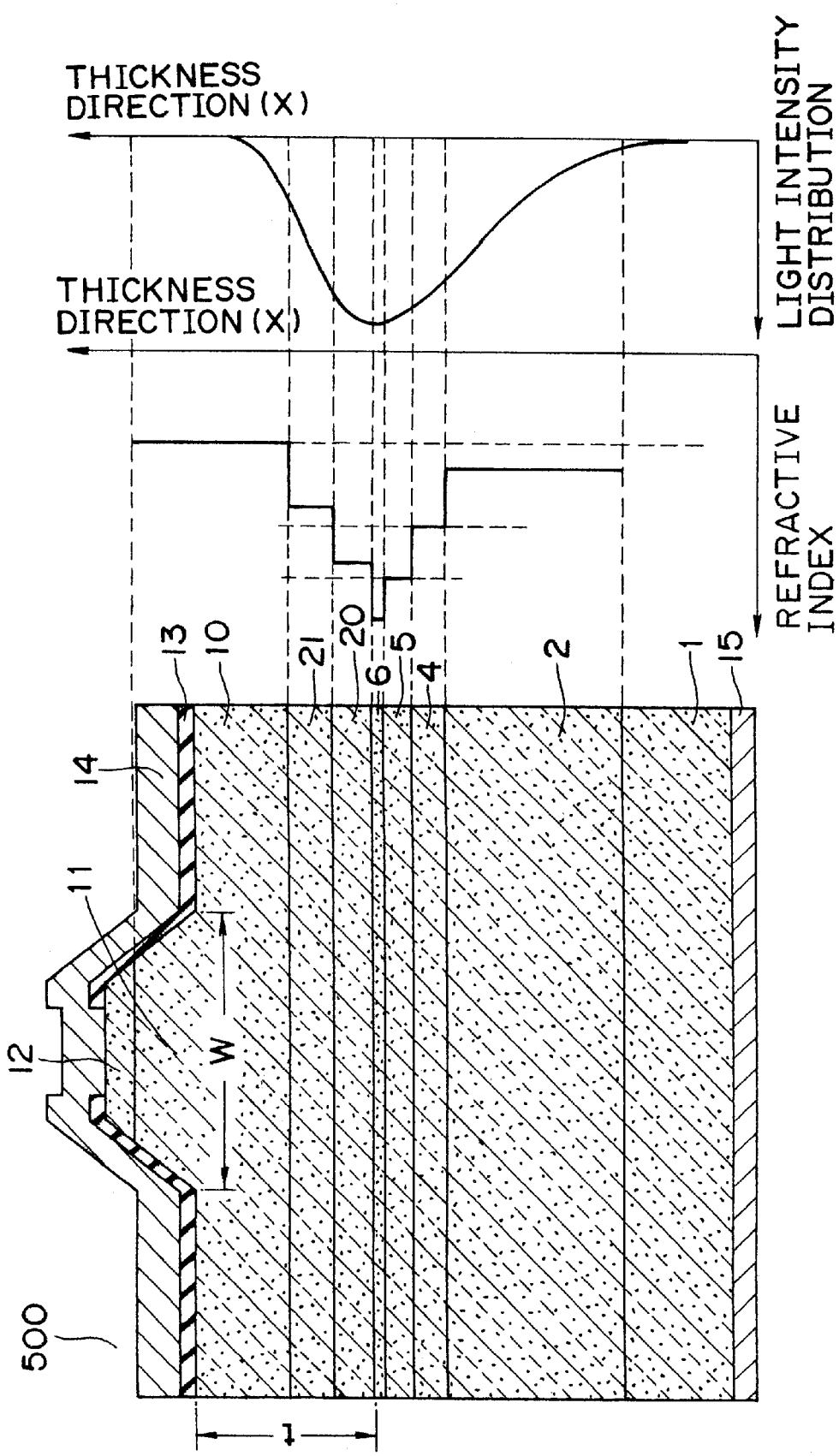

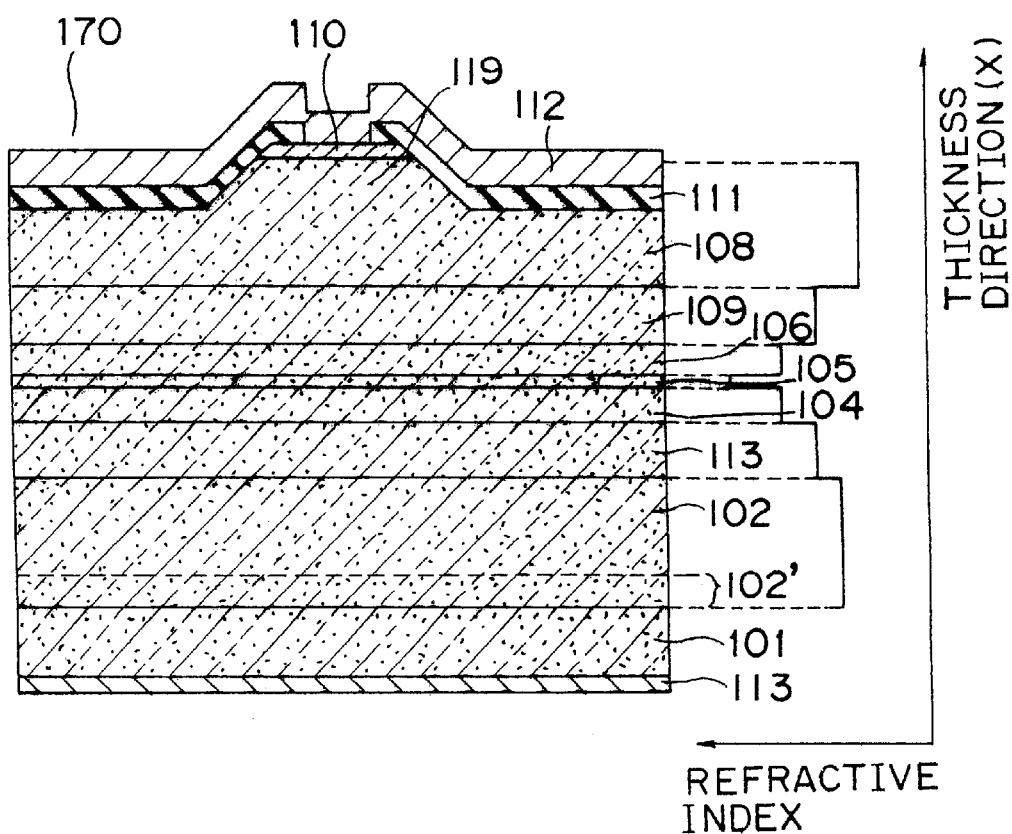

SEMICONDUCTOR LASER

BACKGROUND OF THE INVENTION

The present invention relates to semiconductor lasers, and in particular, to a semiconductor laser to be used for excitation in an optical fiber amplifier.

FIG. 25A is a sectional view of a ridge type semiconductor laser mentioned in JP Hei.11-233883A1. In a semiconductor laser, which is generally indicated by the reference numeral 170, an n-type GaAs substrate 101 is used as a substrate. The GaAs substrate 101 is laminated with an n-type AlGaAs cladding layer 102, an undoped AlGaAs second guide layer 103, an undoped GaAs first guide layer 104 and an undoped InGaAs active layer 105, the layers being stacked in this order. Further, an undoped GaAs first guide layer 106, an undoped AlGaAs second guide layer 107 and a p-type AlGaAs cladding layer 108 are laminated in this order in positions symmetrical about the active layer 105. The p-type AlGaAs cladding layer 108 has a ridge structure for causing current constriction. A p-type GaAs contact layer 110 is formed on a ridge portion 109. Further, an insulating layer 111 is formed so that the p-type GaAs contact layer 110 is partially exposed, and a p-side electrode 112 that is electrically connected to the exposed portion of the p-type GaAs contact layer 110 is formed on the insulating layer 111. On the other hand, an n-side electrode 113 is formed on the opposite surface of the GaAs substrate 101.

The semiconductor laser 170 shown in FIG. 25A is formed so that a refractive index ($n_{1c}$) of the n-type AlGaAs cladding layer 102 is made greater than a refractive index ($n_{uc}$) of the p-type AlGaAs cladding layer 108 (FIG. 25B). Therefore, a light intensity distribution of laser light generated in the active layer 105 becomes a distribution in which a peak position is shifted toward the GaAs substrate 101. Consequently, a far field pattern (FFP) in the x-axis direction of the light intensity distribution becomes narrowed, allowing the laser light aspect ratio ($\theta_V$ ($\theta$ in the x-axis direction)/$\theta_H$ ($\theta$ in the y-axis direction), $\theta$: full angle at half maximum) to be reduced.

Moreover, the light intensity distribution toward the ridge portion 109 is reduced, and the discontinuous refractive index distribution of the ridge portion 109 exerts less influence. Therefore, a kink that occurs due to a change in a lateral mode, i.e., a discontinuous point of an optical output caused by a change from fundamental mode light emission into first order mode light emission is raised to allow a stabilized emission light intensity to be obtained.

However, the semiconductor laser 170 shown in FIG. 25A has had the problem that a variation efficiency (dP/dI) of the optical output with respect to a variation in current is great with regard to the kink level attributed to a change in a longitudinal mode, i.e., a current-to-optical-output characteristic of the semiconductor laser, and thereby, a stabilized light intensity cannot be obtained. In particular, if the semiconductor laser is used as a semiconductor laser for excitation in an optical fiber amplifier, then a fluctuation in light intensity is amplified. Therefore, the stabilization of light intensity has been a serious problem. There have been the further problems of an increase in threshold current, a reduction in optical output efficiency and so on occurring when the semiconductor laser comes to have an elevated temperature as a consequence of light emission.

FIG. 26 shows a current-to-optical-output (P-I) characteristic and a current-to-efficiency (dP/dI-I) characteristic of the semiconductor laser 170 shown in FIG. 25A. The horizontal axis represents the current (I), and the vertical axis represents the optical output (P) and the efficiency (dP/dI). The line (a) indicates a relation between the current (I) and the optical output (P), and the line (b) indicates a relation between the current (I) and the efficiency (dP/dI).

As shown in FIG. 26, according to the semiconductor laser 170, the efficiency (dP/dI) significantly varies with respect to a variation in current, and thereby, stabilized light emission cannot be obtained. As mentioned in "Analysis of the mode internal coupling in InGaAs/GaAs laser diodes", Laser Physics, Vol. 4, No. 3, pp. 485–492, 1994 written by P. G. Eliseev and A. E. Drakin, the cause is considered to be a resonance of light between the p-side electrode 112 and the n-side electrode 113.

Furthermore, according to the results of researches conducted by the present inventors, it was discovered that the laser light resonated between the p-side electrode 112 and the n-side electrode 113 since the laser light spread in the GaAs substrate 101 was not absorbed by the GaAs substrate 101. Accordingly, the inventors discovered that stabilized laser light emission could be obtained by restraining the spreading of laser light into the GaAs substrate 101 for a reduction in the optical output efficiency (dP/dI), completing the present invention.

SUMMARY OF THE INVENTION

Accordingly, the present invention has the object of providing a semiconductor laser that has a great laser light aspect ratio, a high kink level of transition from light emission in a fundamental mode to light emission in a first order mode and a small variation in optical output efficiency (dP/dI).

It is a further object to provide a semiconductor laser in which an increase in threshold current and a reduction in the optical output efficiency (dP/dI) at an elevated temperature are prevented.

The present invention provides a semiconductor laser that includes a semiconductor substrate, an active layer formed on the semiconductor substrate, guide layers laminated on both sides of the active layer, and cladding layers laminated on both sides of the guide layers, wherein a low refractive index layer having a refractive index lower than that of the cladding layer is interposed between the guide layer and the cladding layer, and a total layer thickness of the active layer and the guide layers is not less than about 15 percent of an oscillation wavelength of the semiconductor laser.

By thus inserting the low refractive index layer, the distribution of the emission light can be confined in the low refractive index layer, the guide layer and the active layer. With this arrangement, the light intensity of a near field pattern is increased and the divergent angle of the laser light can be reduced.

This arrangement can also prevent the light emission mode from shifting from the fundamental mode to a higher-order mode, allowing stabilized light emission to be obtained.

This can also prevent the increase in the threshold current and the reduction in the optical output efficiency at an elevated temperature.

A total layer thickness of the active layer and the guide layer should preferably be about 18% of the oscillation wavelength of the semiconductor laser.

By thus setting the layer thicknesses of the active layer and the guide layer, the emission light can be sufficiently confined in the layers. With this arrangement, the increase in the threshold current and the reduction in the light emission efficiency at an elevated temperature can be prevented.

The low refractive index layer should preferably be provided on one side or both sides of the active layer. The above arrangement is adopted because the effect of confining the emission light can be obtained by inserting the low refractive index layer on one side or both sides of the active layer.

The present invention further provides a semiconductor laser that includes a semiconductor substrate, an active layer formed on the semiconductor substrate, a first guide layer laminated on one side of the active layer, a first cladding layer that is laminated on the first guide layer and is at least partially provided with a current constriction portion, a second guide layer laminated on the other surface of the active layer, and a second cladding layer that is laminated on the second guide layer and has a refractive index higher than that of the first cladding layer, wherein a distribution of emission light of the semiconductor laser is shifted so that the emission light has a maximum intensity inside the active layer.

By making the refractive index of the second cladding layer higher than the refractive index of the first cladding layer, the distribution of the emission light is shifted to the second cladding side, and this allows stabilized laser light of a small aspect ratio to be obtained.

By positioning the peak position of the laser light in the active layer, the light emission efficiency can be increased.

The present invention further provides a semiconductor laser in which the refractive index of the first guide layer is made greater than the refractive index of the second guide layer to shift the distribution of the emission light.

By employing the above structure, the peak position of the emission light can be shifted into the active layer.

The present invention further provides a semiconductor laser in which the layer thickness of the first guide layer is made greater than the layer thickness of the second guide layer to shift the distribution of the emission light.

By employing the above structure, the peak position of the emission light can be shifted into the active layer.

The present invention further provides a semiconductor laser in which the band gap of the first guide layer is made greater than the band gap of the second guide layer.

In the above structure, the overflow of electrons from the active layer injected into the active layer can be reduced to allow the light emission efficiency to be increased.

The present invention further provides a semiconductor laser in which the second cladding layer is arranged between the substrate and the active layer and the layer thickness of the second cladding layer is greater than the layer thickness of the first cladding layer.

In the above structure, the distribution of light into the substrate is reduced, and this allows a resonance phenomenon occurring between electrodes to be restrained. Consequently, a variation in the light emission efficiency (dP/dI) is reduced, and this allows a stabilized optical output to be obtained.

The present invention provides a semiconductor laser that includes a GaAs substrate, an $In_xGa_{1-x}As$ ($0<x\leqq0.3$) active layer formed on the GaAs substrate, a first guide layer laminated on one surface of the active layer, a first cladding layer that is laminated on the first guide layer and is at least partially provided with a current constriction portion, and a second guide layer and a second cladding layer that are laminated in order on the other surface of the active layer, wherein a normalized frequency of the first guide layer is made higher than a normalized frequency of the second guide layer.

In the above semiconductor laser, the light intensity distribution into a GaAs layer such as a GaAs substrate or a GaAs contact layer can be reduced, and this allows the resonance of light between the p-side electrode and the n-side electrode to be reduced. With this arrangement, the kink level attributed to a variation in a longitudinal mode with regard to a current-to-optical-output characteristic can be improved, and accordingly, the light intensity variation efficiency (dP/dI) can be restrained. Therefore, a semiconductor laser having a stabilized optical output can be obtained.

The normalized frequency V is defined by the following equation 1:

$$V = ko \cdot (\sqrt{(n_1^2 - n_2^2)}) \cdot T$$

where ko: the wave number in a free space ($2\pi/\lambda$),
$n_1$: the refractive index of the guide layer,
$n_2$: the refractive index of the cladding layer, and
T: layer thickness of the guide layer.

The first cladding layer may be provided on a side opposite from the GaAs substrate with interposition of the $In_xGa_{1-x}As$ active layer.

By employing the above structure, the present invention can be applied to a ridge type semiconductor laser.

The first cladding layer may be provided on the same side as the GaAs substrate with respect to the $In_xGa_{1-x}As$ active layer, and a GaAs contact layer may be laminated on the second cladding layer.

By employing the above structure, the present invention can be applied to a semiconductor laser provided with an embedded type current block layer.

The layer thickness of the first guide layer should preferably be greater than the layer thickness of the second guide layer.

The above arrangement is adopted because the normalized frequency of the first guide layer can be made greater than the normalized frequency of the second guide layer by making the layer thickness of the first guide layer greater than the layer thickness of the second guide layer, according to the aforementioned equation 1.

The refractive index of the first guide layer should preferably be greater than the refractive index of the second guide layer.

The above arrangement is adopted because the normalized frequency of the first guide layer can be made greater than the normalized frequency of the second guide layer by making the refractive index of the first guide layer greater than the refractive index of the second guide layer, according to the aforementioned equation 1.

The refractive index of the second cladding layer should preferably be greater than the refractive index of the first cladding layer.

By employing the above structure, the aspect ratio of the laser light is improved, and this allows the kink caused by a modal change in the lateral mode of light intensity to be increased with regard to the current-to-optical-output characteristics. With this arrangement, a stabilized light intensity can be obtained.

The layer thickness of the second cladding layer should preferably be greater than the layer thickness of the first cladding layer.

By employing the above structure, a distance between the InGaAs active layer and the GaAs substrate is increased, and-this allows the light intensity distribution into the GaAs substrate to be further restrained.

BRIEF DESCRIPTION OF THE DRAWINGS

FIG. 4 is a sectional view of a conventional semiconductor laser;

FIGS. 5A, 5B and 5C show a sectional view, a refractive index distribution and a light intensity distribution, respectively, of a conventional semiconductor laser;

FIGS. 6A, 6B and 6C show a sectional view, a refractive index distribution and a light intensity distribution, respectively, of a semiconductor laser according to a second embodiment of the present invention;

FIGS. 7A, 7B and 7C show a sectional view, a refractive index distribution and a light intensity distribution, respectively, of the semiconductor laser of the second embodiment of the present invention;

FIGS. 9A, 9B and 9C show a sectional view, a refractive index distribution and a light intensity distribution, respectively, of a semiconductor laser according to a third embodiment of the present invention;

FIGS. 10A, 10B and 10C show a sectional view, a refractive index distribution and a light intensity distribution, respectively, of the semiconductor laser of the third embodiment of the present invention;

FIGS. 11A, 11B and 11C show a sectional view, a. refractive index distribution and a light intensity distribution, respectively, of the semiconductor laser of the third embodiment of the present invention;

FIGS. 12A, 12B and 12C show a sectional view, a refractive index distribution and a light intensity distribution, respectively, of the semiconductor laser of the third embodiment of the present invention;

FIGS. 13A, 13B and 13C show a sectional view, a refractive index distribution and a light intensity distribution, respectively, of the semiconductor laser of the third embodiment of the present invention;

FIGS. 14A, 14B and 14C show a sectional view, a refractive index distribution and a light intensity distribution, respectively, of a semiconductor laser according to a fourth embodiment of the present invention;

FIGS. 15A, 15B and 15C show a sectional view, a refractive index distribution and a light intensity distribution, respectively, of the semiconductor laser of the fourth embodiment of the present invention;

FIGS. 16A, 16B and 16C show a sectional view, a refractive index distribution and a light intensity distribution, respectively, of the semiconductor laser of the fourth embodiment of the present invention;

FIGS. 17A, 17B and 17C show a sectional view, a refractive index distribution and a light intensity distribution, respectively, of the semiconductor laser of the fourth embodiment of the present invention;

FIGS. 18A, 18B and 18C show a sectional view, a refractive index distribution and a light intensity distribution, respectively, of the semiconductor laser of the fourth embodiment of the present invention;

FIGS. 19A, 19B and 19C show a sectional view, a refractive index distribution and a light intensity distribution, respectively, of a semiconductor laser according to a fifth embodiment of the present invention;

FIGS. 25A and 25B show a sectional view and a refractive index distribution, respectively, of a conventional semiconductor laser.

DETAILED DESCRIPTION OF THE PREFERRED EMBODIMENTS

FIRST EMBODIMENT

Figure 1:
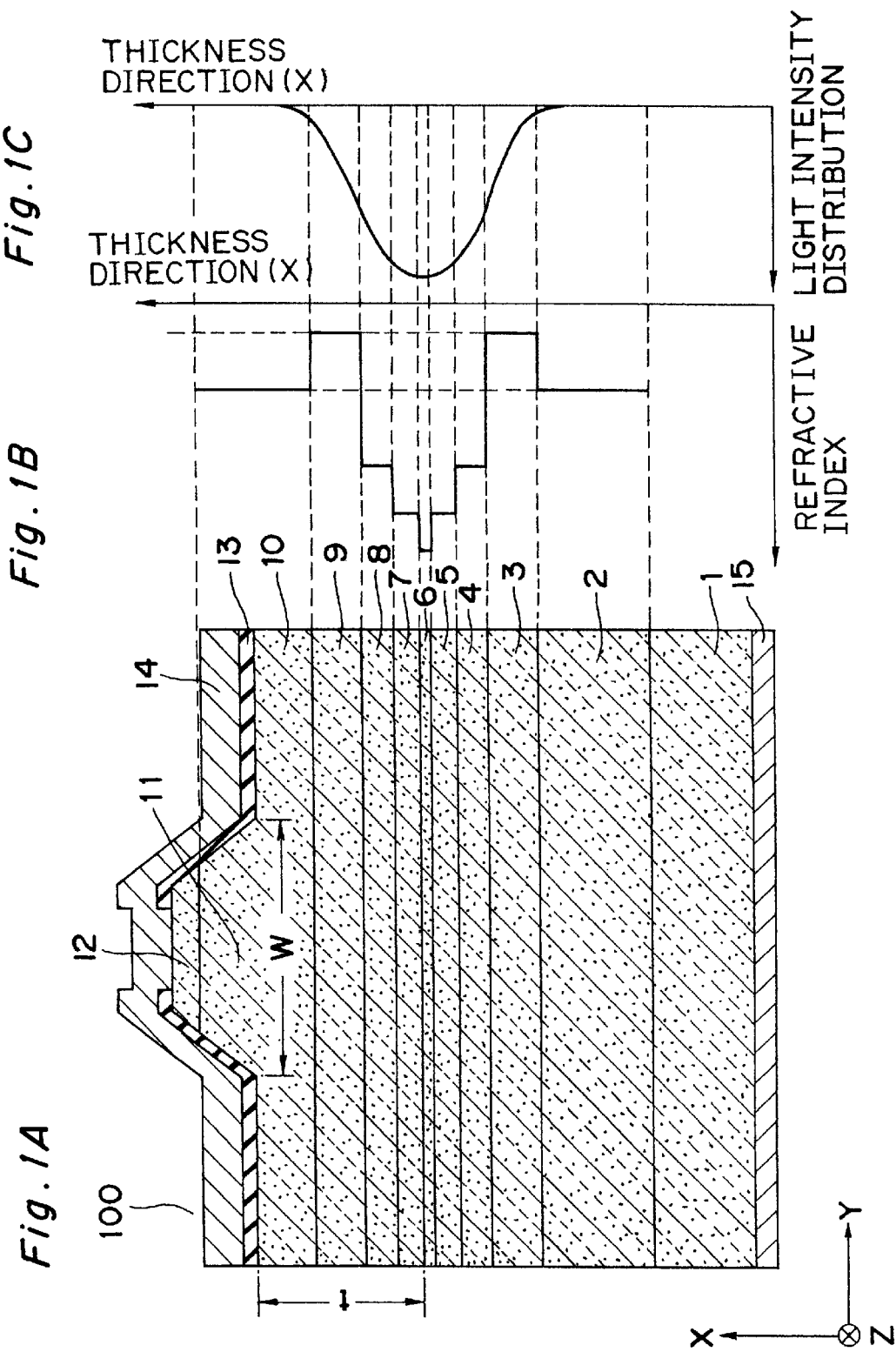
FIGS. 1A, 1B and 1C show a sectional view, a refractive index distribution and a light intensity distribution, respectively, of a semiconductor laser according to a first embodiment of the present invention.

FIG. 1A is a sectional view of a semiconductor laser according to the first embodiment of the present invention. In the semiconductor laser generally indicated by the reference numeral 100, an n-$Al_{0.3}Ga_{0.7}As$ first cladding layer 2 having a thickness of 0.9 $\mu$m is formed on an n-GaAs substrate 1. On the first cladding layer 2 is formed an n-$Al_{0.35}Ga_{0.65}As$ second cladding layer (low refractive index layer) 3 having a thickness of 0.9 $\mu$m.

Further, an i-$Al_{0.20}Ga_{0.80}As$ guide layer 4 having a thickness of 40 nm, an i-$GaAs_{0.958}P_{0.042}$ guide layer 5 having a thickness of 40 nm, an $In_{0.113}Ga_{0.887}As$ active layer 6 having a thickness of 15 nm, an undoped i-$GaAs_{0.958}P_{0.042}$ guide layer 7 having a thickness of 40 nm and an i-$Al_{0.20}Ga_{0.80}As$ guide layer 8 having a thickness of 40 nm are laminated.

On the guide layer 8 are formed a p-$Al_{0.35}Ga_{0.65}As$ second cladding layer (low refractive index layer) 9 having a thickness of 0.9 $\mu$m and a p-$Al_{0.3}Ga_{0.7}As$ first cladding layer 10 having a thickness of 0.9 $\mu$m. The refractive index of the second cladding layer 9 is made lower than the refractive index of the first cladding layer 10.

The first cladding layer 10 is provided with a ridge portion 11 formed as a current constriction layer. A p-GaAs contact layer 12 is formed on the ridge portion 11, and an insulating film 13 is further provided. A p-side electrode 14 is formed on the insulating film 13 so as to be electrically connected to the contact layer 12. An n-side electrode 15 is formed on the rear surface of the substrate 1.

FIGS. 1B and 1C show a refractive index distribution and a light intensity distribution in the direction of thickness (x-axis direction) of the semiconductor laser 100.

In each of the figures mentioned below, the x-axis, y-axis and z-axis directions are assumed to be the same as the directions of the respective axes shown in FIG. 1A.

Figure 2:
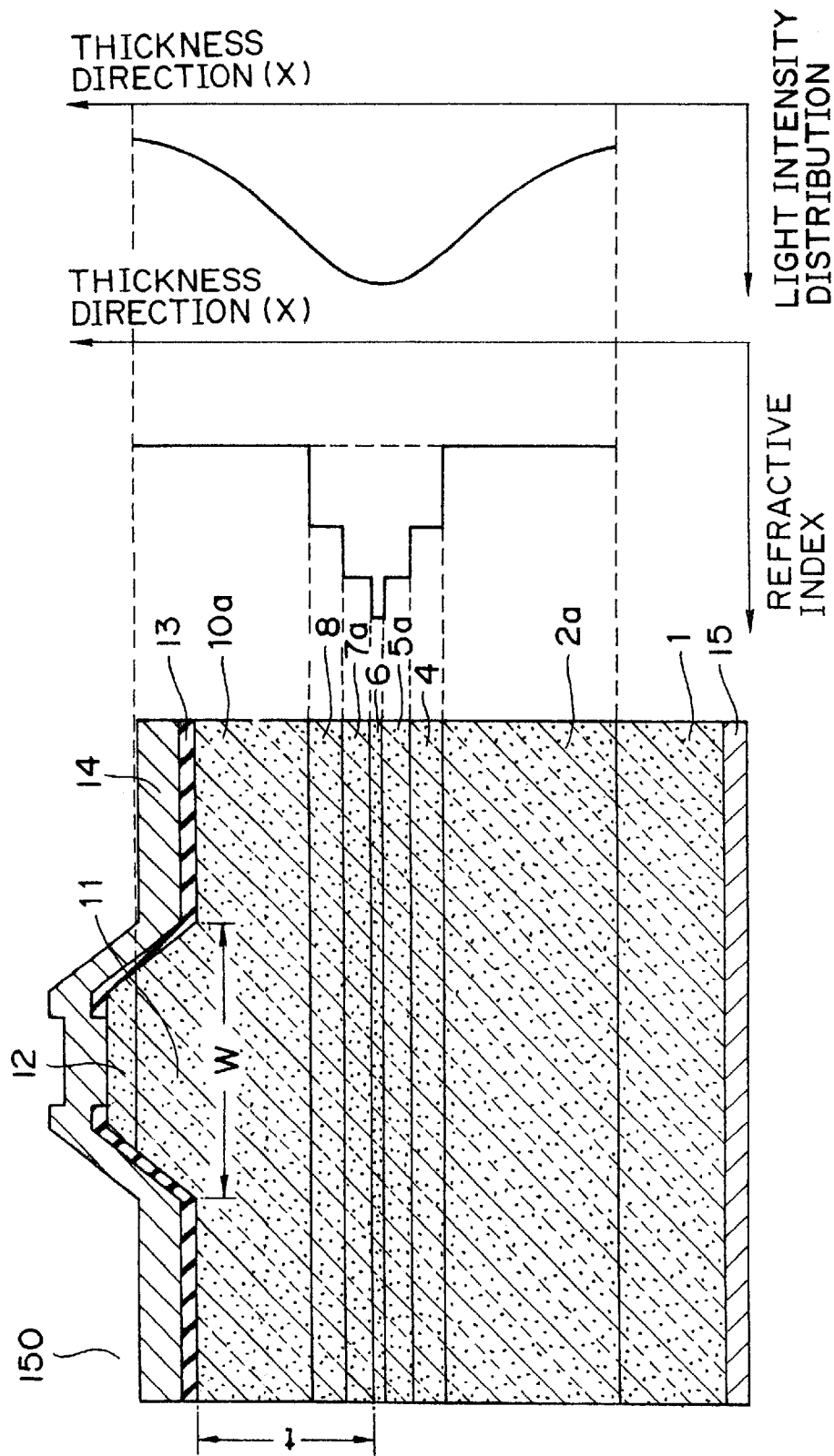
FIGS. 2A, 2B and 2C show a sectional view, a refractive index distribution and a light intensity distribution, respectively, of a semiconductor laser according to a first comparative example.

FIG. 2A is a sectional view of a semiconductor laser 150 of a first comparative example provided with neither of the low refractive index layers 3 and 9. The portions denoted by the same reference numerals as used in FIG. 1A indicate identical or corresponding portions. There are provided an n-$Al_{0.30}Ga_{0.70}As$ first cladding layer 2a having a thickness of 1.8 μm, an i-$GaAs_{0.950}P_{0.050}$ layer 5a having a thickness of 34 nm, an i-$GaAs_{0.950}P_{0.050}$ layer 7a having a thickness of 34 nm and a p-$Al_{0.3}Ga_{0.7}As$ first cladding layer 10a having a thickness of 1.8 μm.

FIGS. 2B and 2C show a refractive index distribution and a light intensity distribution in the direction of thickness (x-axis direction) of the semiconductor laser 150.

Figure 3:
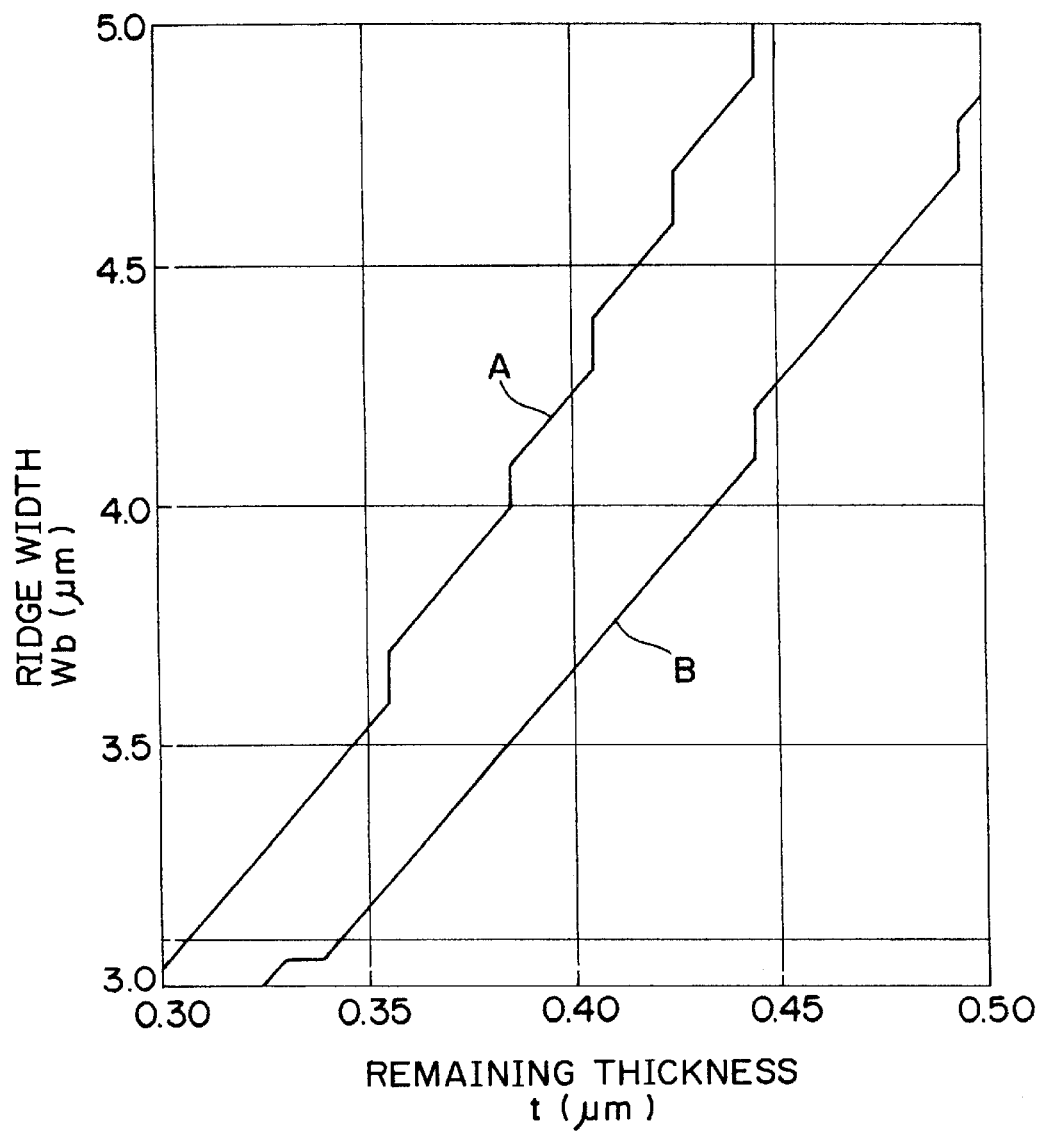
FIG. 3 is a graph showing a cutoff boundary between a fundamental mode and a first order mode.

FIG. 3 shows a boundary (cutoff boundary) across which laser light in the lateral mode changes from a fundamental mode (zero-order mode) to a first order mode. In FIG. 3, the horizontal axis represents a remaining layer thickness t, and the vertical axis represents a ridge width w (see FIGS. 1A and FIG. 2A for t and w).

In the figure, the line A represents the cutoff boundary of the semiconductor laser 100 of FIG. 1A, and the line B represents the cutoff boundary of the semiconductor laser 150 of FIG. 2A. Regions above the lines A and B are the regions that tolerate both the fundamental mode and the first order mode, and regions below the lines A and B are the regions that tolerate only the fundamental mode.

As is apparent from FIG. 3, if the remaining layer thickness t and the ridge width w of the semiconductor laser are changed, then the semiconductor laser 100 (line A) has the fundamental mode in a wider region. That is, by employing the semiconductor laser 100 of the present embodiment, the stable region that tolerates only the fundamental mode can be remarkably expanded.

This is presumably ascribed to the fact that the light intensity distribution becomes narrowed from the state of FIG. 2C to the state of FIG. 1C due to the insertion of the low refractive index layers 3 and 9.

FIG. 4 is a sectional view of a real refractive index type semiconductor laser 160 described in Jpn. J. Appl. Phys. Vol. 36 pp. 2676–2680, 1997 (T. Hashimoto, et al., "Reduction of Beam Divergence Angle by Low-Refractive-Index Layers Introduced to Real-Refractive-Index-Guided GaAlAs High-Power Laser Diodes"). In the semiconductor laser generally indicated by the reference numeral 160, an n-GaAs buffer layer 202, an n-$Al_{0.48}Ga_{0.52}As$ cladding layer 203 having a thickness of 2.5 μm, an n-AlGaAs low refractive index layer 204, an AlGaAs active layer 205 constructed of a double-quantum well and a p-AlGaAs low refractive index layer 206 having a thickness of 0.15 μm are laminated on an n-GaAs substrate 201.

The active layer 205 includes two guide layers, two quantum well layers and a barrier layer interposed between the quantum well layers, these layers having a total layer thickness of 59 nm.

An n-$Al_{0.625}Ga_{0.375}As$ current block layer 207 having a thickness of 0.7 μm is formed on part of the low refractive index layer 206, and a p-AlGaAs low refractive index layer 208, a p-$Al_{0.48}Ga_{0.52}As$ cladding layer 209 having a thickness of 2.5 μm and a p-GaAs contact layer 210 are formed on the layers.

FIG. 5A is an enlarged view of the stripe portion of the semiconductor laser 160 of FIG. 4. FIG. 5B and FIG. 5C show a refractive index distribution and a light intensity distribution in the direction of thickness (x-axis direction) of the semiconductor laser 160.

In the semiconductor laser 160 of FIG. 4, the thickness of the active layer 205 in the stripe portion is 59 nm, as described hereinabove. The thickness (59 nm) is a very small thickness, which is about 8% of the oscillation wavelength of 780 nm of the semiconductor laser 160. Therefore, light confinement is weak in the x-axis direction.

In the semiconductor laser 160 of FIG. 4, low refractive index layers 204, 206 and 208 are sandwiched between the active layer 205 and the cladding layers 203 and 209, and therefore, the refractive index distribution becomes as shown in FIG. 5B.

In FIG. 5C, the solid line indicates the light intensity distribution of the semiconductor laser 160, and the dashed line indicates the light intensity distribution when no low refractive index layer is inserted. As is apparent from the figure, the active layer 205 and the cladding layers 203 and 209 gain increased light intensities by virtue of the insertion of the low refractive index layers 204, 206 and 208, and the low refractive index layers 204, 206 and 208 have reduced light intensities. Therefore, the effective spreading of the emission light can be reduced.

However, the light intensity distribution, which expands in the x-axis direction, tends to receive the influence of the current block layer 207. Consequently, a transition from the fundamental mode to the higher-order modes tends to occur in the lateral mode, and a reduction in optical output is observed.

As described hereinabove, a rate of confinement of light in the active layer 205 is reduced, and this causes an increase in threshold current and a reduction in light emission efficiency at an elevated temperature.

In contrast to this, according to the semiconductor laser 100 of the present embodiment shown in FIG. 1A, the total layer thickness of the guide layer and the active layer is 175 nm. The thickness (175 nm) is about 18% of the oscillation wavelength of 980 nm of the semiconductor laser 100 and is greater than that of the semiconductor laser 160 of FIG. 4. Therefore, an increased quantity of emission light can be confined in the guide layer and the active layer.

Consequently, according to the semiconductor laser 100 of FIG. 1A, the rate of confinement of light in the active layer becomes 4.05%. In contrast to this, in the semiconductor laser 150 in which no low refractive index layer as in FIGS. 2A, 2B and 2C is inserted, the rate of confinement of light in the active layer becomes 3.45%.

As described above, by setting the total layer thickness of the guide layer and the active layer of the semiconductor laser to a thickness of not less than 15% of the oscillation wavelength, the emission light can be sufficiently confined in the active layer. With this arrangement, an increase in threshold current and a reduction in light emission efficiency at an elevated temperature can be prevented.

It is to be noted that the divergent angle of the emission light of the semiconductor laser 100 of FIG. 1A in which the low refractive index layer is inserted is 29.4°. On the other hand, the divergent angle of the emission light of the semiconductor laser 150 of FIG. 2A in which no low refractive index layer is inserted is 29.5°.

As described above, according to the semiconductor laser 100 of the present embodiment, the divergent angle of the emission light does not increase regardless of the fact that the rate of confinement of light in the active layer is increased by inserting the low refractive index layer.

Dissimilar to the semiconductor laser 160 of FIG. 4, the above phenomenon is ascribed to the fact that light is sufficiently confined in the guide layer and the active layer since the total layer thickness of the guide layer and the active layer is sufficiently great in the semiconductor laser 100 of the present embodiment and the light distribution into the low refractive index layer (second cladding layer) and the first cladding layer can be reduced.

Furthermore, the semiconductor laser 100 of the present embodiment, in which the light distribution into the n-AlGaAs first cladding layers 2 and 10 is also small, receives less influence from the refractive index distribution in the transverse direction (y-axis direction) of the ridge portion 11. Consequently, as shown in FIG. 3, the region in which light is emitted in the fundamental mode can be increased.

SECOND EMBODIMENT

FIG. 6A is a sectional view of a semiconductor laser 200 according to the present embodiment. The semiconductor laser 200 has the same structure as that of the semiconductor laser 100 of FIG. 1A.

It is to be noted that an n-$Al_{0.28}Ga_{0.72}As$ first cladding layer 2 having a thickness of 1.3 $\mu$m, an n-$Al_{0.35}Ga_{0.65}As$ second cladding layer 3 having a thickness of 0.5 $\mu$m, a p-$Al_{0.35}Ga_{0.65}As$ second cladding layer 9 having a thickness of 0.5 $\mu$m and a p-$Al_{0.30}Ga_{0.70}As$ first cladding layer 10 having a thickness of 1.3 $\mu$m are employed.

FIG. 6B is a refractive index distribution in the direction of thickness. By making the composition ratio of Al of the first cladding layer 2 greater than that of the first cladding layer 10, the refractive index of the first cladding layer 2 is made greater than the refractive index of the first cladding layer 10.

FIG. 6C is a light intensity distribution in the direction of thickness. In the figure, the solid line indicates the light intensity distribution of the semiconductor laser 200 of the present embodiment. The dashed line indicates the light intensity distribution of a semiconductor laser in which the Al composition ratio of the first cladding layer 2 is equal to that of the first cladding layer 10.

As is apparent from FIG. 6C, according to the semiconductor laser 200 of the present embodiment, the emission light intensity distribution expands toward the substrate 1. Consequently, a far field pattern in the x-axis direction of the light intensity distribution becomes narrowed, and this allows the laser light aspect ratio to be reduced.

In the semiconductor laser 200 of the present embodiment, the low refractive index layers 3 and 9 are formed. Therefore, the effect of largely increasing the light emission region of only the fundamental mode and so on can be obtained, similarly to the semiconductor laser 100 of the first embodiment.

FIG. 7A is a sectional view of another semiconductor laser 210 of the present embodiment. The portions denoted by the same reference numerals as used in FIG. 6A indicate identical or corresponding portions.

FIG. 7B shows a refractive index distribution in the direction of thickness (x-axis direction) of the semiconductor laser 210, while FIG. 7C shows the light intensity distribution in the direction of thickness.

In the semiconductor laser 210 shown in FIG. 7A, the low refractive index layer 9 is provided only between the second guide layer 8 and the first cladding layer 10. The layer thickness of the first cladding layer 2 is increased from 1.3 $\mu$m to 1.8 $\mu$m. The other structure is the same as that of the semiconductor laser 200.

As described above, by making the Al composition ratio of the first cladding layer 2 (n-$Al_{0.28}Ga_{0.72}As$) smaller than that of the first cladding layer 10 (p-$Al_{0.30}Ga_{0.70}As$) and making the refractive index of the first cladding layer 2 higher than the refractive index of the first cladding layer 10, the emission light intensity distribution can be expanded toward the substrate 1. Consequently, the far field pattern in the x-axis direction of the light intensity distribution becomes narrowed similarly to the semiconductor laser 200, and this allows the laser light aspect ratio to be reduced.

By inserting the low refractive index layer 9 only on the ridge portion 11 side with respect to the active layer 6, the light confining rate in the active layer 6 is increased, and this can prevent the increase in the threshold current and the reduction in the light emission efficiency at an elevated temperature.

By increasing the layer thickness of the first cladding layer 2 for an increase in distance from the emission light peak position to the n-GaAs substrate 1, the light distribution in the substrate 1 can be reduced. With this arrangement, the light resonance between the electrodes 14 and 15 can be suppressed, as described later.

Figures 8A, 8B, 8C:
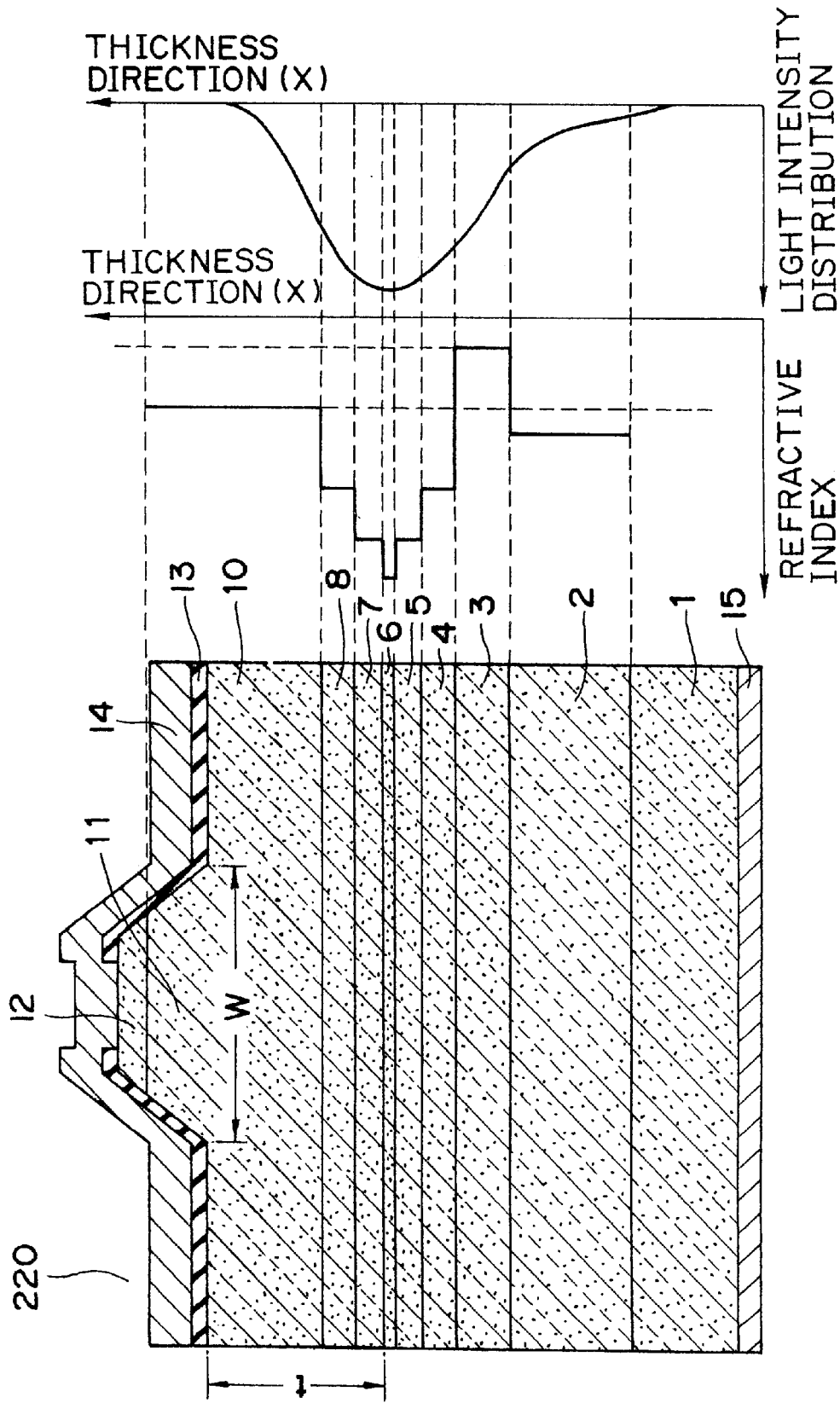
FIGS. 8A, 8B and 8C show a sectional view, a refractive index distribution and a light intensity distribution, respectively, of the semiconductor laser of the second embodiment of the present invention.

FIG. 8A is a sectional view of another semiconductor laser 220 according to the present embodiment. The portions denoted by the same reference numerals as used in FIG. 6A indicate identical or corresponding portions.

FIG. 8B shows a refractive index distribution in the direction of thickness (x-axis direction) of the semiconductor laser 220, while FIG. 8C shows the light intensity distribution in the direction of thickness.

In the semiconductor laser 220 shown in FIG. 8A, the low refractive index layer 3 is provided only between the first cladding layer 2 and the second guide layer 4. The other structure is the same as that of the semiconductor laser 200.

As described above, by making the refractive index of the first cladding layer 2 higher than the refractive index of the first cladding layer 10, the emission light distribution can be expanded toward the substrate 1. Consequently, the laser light aspect ratio can be reduced similarly to the semiconductor laser 200.

Also, by inserting the low refractive index layer 9 only on the substrate 1 side with respect to the active layer 6, the light confining rate in the active layer 6 is increased, and this can prevent the increase in the threshold current and the reduction in the light emission efficiency at an elevated temperature.

THIRD EMBODIMENT

FIG. 9A shows a sectional view of a semiconductor laser 300 of the present embodiment. In the semiconductor laser generally indicated by the reference numeral 300, an n-$Al_{0.28}Ga_{0.72}As$ first cladding layer 2 having a thickness of 0.8 $\mu$m is formed on an n-GaAs substrate 1.

On the first cladding layer 2 are formed an i-$Al_{0.20}Ga_{0.80}As$ guide layer 4 having a thickness of 40 nm, an i-$GaAs_{0.958}P_{0.042}$ guide layer 5 having a thickness of 40 nm, an $GaAs_{0.113}Ga_{0.887}As$ active layer 6 having a thickness of 15 nm, an undoped i-$GaAs_{0.958}P_{0.042}$ guide layer 7 having a thickness of 50 nm and an i-$Al_{0.20}Ga_{0.80}As$ guide layer 8 having a thickness of 50 nm.

On the guide layer 8 is formed a p-$Al_{0.30}Ga_{0.70}As$ first cladding layer 10 having a thickness of 1.8 $\mu$m.

The first cladding layer 10 is provided with a ridge portion 11 formed as a current constriction layer. A p-GaAs contact layer 12 is formed on the ridge portion 11, and an insulating film 13 is further provided. A p-side electrode 14 is formed on the insulating film 13 so as to be electrically connected to the contact layer 12. An n-side electrode 15 is formed on the rear surface of the substrate 1.

FIG. 9B shows a refractive index distribution in the direction of thickness (x-axis direction) of the semiconductor laser 300, while FIG. 9C shows a light intensity distribution in the direction of thickness.

By thus making the refractive index of the first cladding layer 2 greater than the refractive index of the first cladding layer 10, the light intensity distribution of the emission light can be expanded toward the substrate 1, similarly to the second embodiment. With this arrangement, the aspect ratio of the laser light can be reduced.

However, if the emission light distribution is expanded toward the substrate 1 as indicated by the dashed line in FIG. 9C, then the emission light intensity peak position (the position where the emission light intensity is maximized) also shifts toward the substrate 1. As described above, if the emission light intensity peak position is displaced from the active layer 6, then the light emission efficiency of the semiconductor laser 300 is reduced.

Accordingly, in the present embodiment, the layer thickness (100 nm in total) of the guide layer (i-GaAsP layer 7 and i-AlGaAs layer 8) located on the ridge 11 side with respect to the active layer 6 is made greater than the layer thickness (80 nm in total) of the guide layer (i-AlGaAs layer 4 and i-GaAsP layer 5) located on the substrate side. With this arrangement, the emission light intensity peak position shifted on the substrate 1 side can be shifted toward the ridge 11 side and moved into the active layer 6. Consequently, an interaction between light and carrier can be increased, and this allows the light emission efficiency to be increased.

FIG. 10A is a sectional view of another semiconductor laser 310 of the present embodiment. The portions denoted by the same reference numerals as used in FIG. 9A indicate identical or corresponding portions.

FIG. 10B shows a refractive index distribution in the direction of thickness (x-axis direction) of the semiconductor laser 310, while FIG. 10C shows the light intensity distribution in the direction of thickness.

The semiconductor laser 310 has a structure obtained by inserting low refractive index layers 3 and 9 into the semiconductor laser 300.

In the semiconductor laser 310, the emission light intensity peak position shifted on the substrate 1 side can be shifted toward the ridge side and the peak position can be moved into the active layer 6, similarly to the semiconductor laser 300. Consequently, an interaction between light and carrier can be increased, and this allows the light emission efficiency to be increased.

With regard to the light emission efficiency, a slope efficiency, which has been about 0.85 W/A in the semiconductor laser (FIGS. 2A, 2B and 2C) of the conventional structure, is increased to about 0.95 W/A in the semiconductor laser 310.

By inserting the low refractive index layers 3 and 9, the light confining rate in the active layer 6 is increased, and this can prevent the increase in the threshold current and the reduction in the light emission efficiency at an elevated temperature.

FIG. 11A is a sectional view of another semiconductor laser 320 of the present embodiment. The portions denoted by the same reference numerals as used in FIG. 9A indicate identical or corresponding portions.

FIG. 11B shows a refractive index distribution in the direction of thickness (x-axis direction) of the semiconductor laser 320, while FIG. 11C shows the light intensity distribution in the direction of thickness.

In the semiconductor laser 320, the layer thickness of the first cladding layer 2 (n-AlGaAs) of the semiconductor laser 310 is increased from 0.8 µm to 3.0 µm.

As described above, by increasing a distance from the emission light peak position to the n-GaAs substrate 1, the light distribution into the substrate 1 can be reduced.

As a result, the light resonance between the electrodes 14 and 15 pointed out by P. G. Eliseev and A. E. Drakin can be suppressed ("Analysis of the mode internal coupling in InGaAs/GaAs laser diodes", Laser Physics, Vol. 4, No. 3, pp. 485–492, 1994).

FIG. 12A shows a sectional view of another semiconductor laser 330 of the present embodiment. The portions denoted by the same reference numerals as used in FIG. 9A indicate identical or corresponding portions.

FIG. 12B shows a refractive index distribution in the direction of thickness (x-axis direction) of the semiconductor laser 330, while FIG. 12C shows the light intensity distribution in the direction of thickness.

The semiconductor laser 330 is obtained by inserting a low refractive index layer 9 (n-$Al_{0.26}Ga_{0.74}As$) having a thickness of 1.8 µm further on the ridge 11 side with respect to the active layer 6 in the semiconductor laser 300.

The rate of confinement of light in the active layer 6 can be increased also by inserting the low refractive index layer 9 only on the ridge 11 side with respect to the active layer 6. Consequently, the increase in the threshold current and the reduction in the light emission efficiency at an elevated temperature can be prevented.

It is to be noted that the same effect can also be obtained by inserting the low refractive index layer only on the substrate 1 side with respect to the active layer 6.

FIG. 13A shows a sectional view of another semiconductor laser 340 of the present embodiment. The portions denoted by the same reference numerals as used in FIG. 9A indicate identical or corresponding portions.

FIG. 13B shows a refractive index distribution in the direction of thickness (x-axis direction) of the semiconductor laser 340, while FIG. 13C shows the light intensity distribution in the direction of thickness.

The semiconductor laser 340 is obtained by inserting a low refractive index layer 9 (n-$Al_{0.26}Ga_{0.74}As$) having a thickness of 1.8 µm further on the ridge 11 side 15 with respect to the active layer 6 and increasing the layer thickness of the first cladding layer 2 (n-AlGaAs) from 0.8 µm to 3.0 µm in the semiconductor laser 300.

By thus inserting the low refractive index layer 9, the rate of confinement of light in the active layer 6 is increased, and this can prevent the increase in the threshold current and the reduction in the light emission efficiency at an elevated temperature.

By increasing the distance from the emission light peak position to the n-GaAs substrate 1, the light resonance between the electrodes 14 and 15 can be suppressed with the reduced light distribution in the substrate 1.

FOURTH EMBODIMENT

FIG. 14A is a sectional view of a semiconductor laser 400 according to the present embodiment. The portions denoted by the same reference numerals as used in FIG. 1A indicate identical or corresponding portions.

FIG. 14B shows a refractive index distribution in the direction of thickness (x-axis direction) of the semiconductor laser 400, while FIG. 14C shows the light intensity distribution in the direction of thickness.

According to the semiconductor laser 400 of the present embodiment, the first cladding layer 2 is formed of n-$Al_{0.28}Ga_{0.72}As$, while the first cladding layer 10 is formed of p-$Al_{0.30}Ga_{0.70}As$. With this arrangement, the refractive index of the first cladding layer 2 becomes higher than the refractive index of the first cladding layer 10.

The refractive index of the guide layers (i-$n_{0.05}Ga_{0.95}As_{0.090}P_{0.010}$ layer 7 and i-$Al_{0.15}Ga_{0.85}As$ layer 8) located on the ridge 11 side with respect to the active layer 6 is made greater than the refractive index of the guide layers (i-$Al_{0.20}Ga_{0.80}As$ layer 4 and i-$GaAs_{0.958}P_{0.042}$ layer 5) located on the substrate side with respect to the active layer 6. It is to be noted that each of the guide layers has a layer thickness of 80 nm.

By thus making the refractive index of the first cladding layer 2 greater than the refractive index of the first cladding layer 10 similarly to the semiconductor laser 300 of the aforementioned third embodiment, the emission light intensity peak position (indicated by the dashed line in FIG. 14C) shifted on the substrate 1 side can be shifted toward the ridge 11 side (indicated by the solid line in FIG. 14C), and the emission light intensity peak position can be moved into the active layer 6. Consequently, an interaction between light and carrier can be increased, and this allows the light emission efficiency to be increased.

FIG. 15A is a sectional view of another semiconductor laser 410 of the present embodiment. The portions denoted by the same reference numerals as used in FIG. 14A indicate identical or corresponding portions.

FIG. 15B shows a refractive index distribution in the direction of thickness (x-axis direction) of the semiconductor laser 410, while FIG. 15C shows the light intensity distribution in the direction of thickness.

According to the semiconductor laser 410, the low refractive index layers 3 and 9 are inserted between the first cladding layers 2 and 10 and the first guide layers 4 and 8 in the semiconductor laser 400. The other structure is the same as that of the semiconductor laser 400.

By thus inserting the low refractive index layers 3 and 9, the rate of confinement of light in the active layer 6 is increased, and this can prevent the increase in the threshold current and the reduction in the light emission efficiency at an elevated temperature.

FIG. 16A is a sectional view of another semiconductor laser 420 of the present embodiment. The portions denoted by the same reference numerals as used in FIG. 14A indicate identical or corresponding portions.

FIG. 16B shows a refractive index distribution in the direction of thickness (x-axis direction) of the semiconductor laser 420, while FIG. 16C shows the light intensity distribution in the direction of thickness.

The semiconductor laser 420 is obtained by increasing the layer thickness of the first cladding layer 2 (n-AlGaAs) from 0.8 μm to 3.0 μm in the semiconductor laser 410.

By thus increasing the distance from the emission light peak position to the n-GaAs substrate 1, the light distribution into the substrate 1 can be reduced. With this arrangement, the light resonance between the electrodes 14 and 15 can be suppressed.

FIG. 17A shows a sectional view of another semiconductor laser 430 of the present embodiment. The portions denoted by the same reference numerals as used in FIG. 14A indicate identical or corresponding portions.

FIG. 17B shows a refractive index distribution in the direction of thickness (x-axis direction) of the semiconductor laser 430, while FIG. 17C shows the light intensity distribution in the direction of thickness.

According to the semiconductor laser 430, the low refractive index layer 3 (n-$Al_{0.35}Ga_{0.65}As$) having a thickness of 0.5 μm is inserted on the substrate 1 side with respect to the active layer 6 and increasing the layer thickness of the first cladding layer 2 (n-AlGaAs) from 0.8 μm to 3.0 μm in the semiconductor laser 400.

By thus inserting the low refractive index layer 3, the rate of confinement of light in the active layer 6 is increased, and this can prevent the increase in the threshold current and the reduction in the light emission efficiency at an elevated temperature.

By increasing the distance from the emission light peak position to the n-GaAs substrate 1, the light resonance between the electrodes 14 and 15 can be suppressed with the reduced light distribution in the substrate 1.

FIG. 18A shows a sectional view of another semiconductor laser 440 of the present embodiment. The portions denoted by the same reference numerals as used in FIG. 14A indicate identical or corresponding portions.

FIG. 18B shows a refractive index distribution in the direction of thickness (x-axis direction) of the semiconductor laser 440, while FIG. 18C shows the light intensity distribution in the direction of thickness.

According to the semiconductor laser 440, the low refractive index layer 3 (n-$Al_{0.35}Ga_{0.65}As$) having a thickness of 0.5 μm is inserted on the substrate 1 side with respect to the active layer 6 in the semiconductor laser 400.

By thus inserting the low refractive index layer 3, the rate of confinement of light in the active layer 6 is increased, and this can prevent the increase in the threshold current and the reduction in the light emission efficiency at an elevated temperature.

A similar effect can also be obtained when the low refractive index layer 3 is inserted on the ridge 11 side with respect to the active layer 6.

FIFTH EMBODIMENT

FIG. 19A is a sectional view of a semiconductor laser 500 according to the present embodiment. The portions denoted by the same reference numerals as used in FIG. 1A indicate identical or corresponding portions.

FIG. 19B shows a refractive index distribution in the direction of thickness (x-axis direction) of a semiconductor laser 500, while FIG. 19C shows the light intensity distribution in the direction of thickness.

According to the semiconductor laser 500 of the present embodiment, the guide layer located on the substrate 1 side with respect to the active layer 6 is constructed of an i-$Al_{0.20}Ga_{0.80}As$ guide layer 4 having a thickness of 40 nm and an i-$GaAs_{0.958}P_{0.042}$ guide layer 5 having a thickness of 40 nm. On the other hand, the guide layer located on the ridge 11 side with respect to the active layer 6 is constructed of an i-$Al_{0.10}Ga_{0.90}As_{0.995}P_{0.005}$ guide layer 20 having a thickness of 60 nm and an i-$Al_{0.25}Ga_{0.75}As$ guide layer 21 having a thickness of 60 nm. The other structure is the same as that of the semiconductor laser 400 of FIG. 14A.

According to the semiconductor laser 500, the refractive index of the first cladding layer 2 is greater than the refractive index of the first cladding layer 10. Therefore, as shown in FIG. 19C, the light intensity distribution is expanded toward the substrate 1, and the spreading of the emission light is reduced. With this arrangement, the laser light aspect ratio can be reduced.

By making the layer thicknesses of the guide layers 20 and 21 located on the ridge 11 side greater than the layer thickness of the guide layers 4 and 5 located on the substrate 1 side, the emission light intensity peak position can be shifted into the active layer 6. With this arrangement, an interaction between light and carrier can be increased, and this allows the light emission efficiency to be increased.

Furthermore, according to the semiconductor laser 500, the band gap of the guide layer 20 is greater than the band gap of the guide layer 5. The band gap of the guide layer 4 is greater than the band gap of the guide layer 21.

With this arrangement, electrons to be injected from the electrode 15 into the active layer 6 are prevented from overflowing toward the electrode 15 side, and the light emission efficiency can be increased.

With regard to the first through fifth embodiments, the structures that have a current constriction layer (ridge portion 11) oppositely from the substrate 1 across the active layer 6 have been described. However, the present invention can also be applied to a structure that has a current constriction layer on the substrate side as shown in, for example, FIG. 4.

The current constriction layer has been described taking the ridge structure as an example. However, the present invention is not limited to this structure. For example, an embedded type current constriction layer may be employed.

For the active layer 6, either a single quantum well structure or multiple quantum wells structure may be employed. According to the semiconductor laser of the present invention, GaAsP is employed as a material for the guide layers 5 and 7 put in contact with the active layer 6. However, if no distortion compensation is effected, then, for example, GaAs can also be employed. The distortion compensation can also be effected totally by the guide layer.

The aforementioned embodiments have been described taking the InGaAs/GaAs system LD (laser diode) as an example. However, the present invention can also be applied to other semiconductor lasers of an AlGaAs/GaAs system LD, an InGaAsP/InP system LD and the like.

SIXTH EMBODIMENT

Figures 20A, 20B:
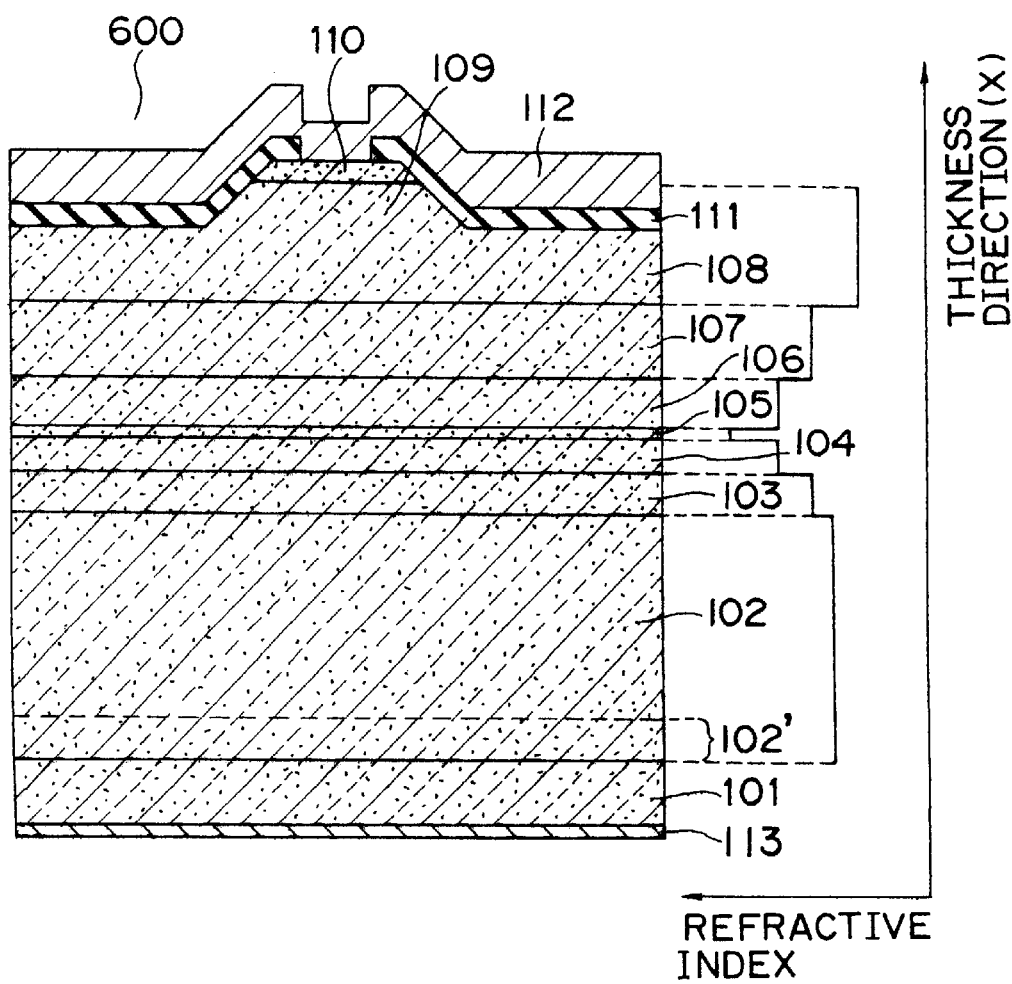
FIGS. 20A and 20B show a sectional view and a refractive index distribution, respectively, of a semiconductor laser according to a sixth embodiment of the present invention.

FIG. 20A is a sectional view of a semiconductor laser according to the sixth embodiment of the present invention. FIG. 20B shows a refractive index in the direction of thickness (x-axis direction). The portions denoted by the same reference numerals as used in FIG. 25A indicate identical or corresponding portions. The layer structure of the semiconductor laser 600 of the present embodiment is roughly identical to the layer structure of the semiconductor laser of FIG. 25A. The present semiconductor laser structure differs in that the layer thickness of guide layers 106 and 107 is made greater than the layer thickness of guide layers 103 and 104 in order to make the normalized frequency of guide layers 106 and 107 located on the ridge side greater than the normalized frequency of guide layers 103 and 104 located on the substrate side.

In this case, the normalized frequency V is expressed by the aforementioned equation 1. Therefore, the normalized frequency V can be increased by increasing the layer thickness T of the guide layer as in the present embodiment.

Specifically, in the structure of FIG. 20A, an n-type AlGaAs cladding layer 102 laminated on an n-type GaAs substrate 101 has a refractive index $n_{1c}$ of 3.3550 and a layer thickness $d_{1c}$ of 2.5 μm.

An undoped AlGaAs second guide layer 103 located on the substrate side has a layer thickness $d_{lg2}$ of 50 nm and a refractive index of 3.406.

An undoped GaAs first guide layer 104 located on the substrate side has a layer thickness $d_{lg1}$ of 10 nm and a refractive index of 3.513.

An undoped InGaAs active layer 105 is constructed of a double-quantum well having a thickness of 8 nm, and a GaAs barrier layer having a thickness of 20 nm is included in the layer. The refractive index is 3.557. The composition of the $In_xGa_{1-x}As$ layer is appropriately selected within a range of $0<x\leq0.3$ so that the desired emission light wavelength can be obtained.

Further, an undoped GaAs first guide layer 106 located on the ridge side has a layer thickness $d_{ug1}$ of 40 nm and a refractive index of 3.513.

An undoped AlGaAs second guide layer 107 located on the ridge side has a layer thickness $d_{ug2}$ of 30 nm and a refractive index of 3.406.

A p-type AlGaAs cladding layer 108 has a refractive index $n_{uc}$ of 3.343 and a layer thickness $d_{uc}$ of 1.8 μm.

As described above, according to the semiconductor laser 600, the first guide layers 104 and 106 and the second guide layers 103 and 107 provided with interposition of the active layer 105 have an identical refractive index. However, the layer thickness of the first and second guide layers 106 and 107 located on the ridge side is made greater than the layer thickness of the first and second guide layers 103 and 104 located on the substrate side. Therefore, the normalized frequency of the guide layers 106 and 107 located on the ridge side becomes greater than the normalized frequency of the guide layers 103 and 104 located on the substrate side.

Consequently, the emission light intensity peak position of the laser light generated in the InGaAs active layer 105 is shifted to the guide layers 106 and 107 side located on the ridge side and becomes able to reduce the light intensity distribution in the GaAs substrate 101.

According to the semiconductor laser 600, the light intensity distribution included in a 0.5-μm thick layer 102' located on the GaAs substrate side becomes 0.07% with respect to the whole of the n-type AlGaAs cladding layer 102.

As described in connection with a comparative example hereinbelow, the light distribution included in the 0.5-μm thick layer 102' located on the GaAs substrate side is 0.59% of the whole of the semiconductor laser 170 that has the conventional structure shown in FIG. 25A.

That is, by employing the structure of the present embodiment, the light intensity distribution included in the 0.5-μm thick layer 102' located on the substrate 101 side in the n-type AlGaAs cladding layer 102 can be reduced to about one ninth that of the semiconductor laser that has the conventional structure of FIG. 6 (the detail of the semiconductor laser 170 having the conventional structure will be described hereinbelow as a second comparative example). This means that the light intensity distribution distributed in the n-type GaAs substrate 101 can also be reduced.

In this case, the light intensity variation efficiency (dP/dI) relative to a variation in current supplied to the semiconductor laser is considered to be generated by the light resonance between the p-side electrode 112 and the n-side electrode 113, as described in the aforementioned "Analysis of the mode internal coupling in InGaAs/GaAs laser diodes". According to the researches conducted by the present inventors, the light resonance between the p-side electrode 112 and the n-side electrode 113 can be reduced by reducing the light distribution in the GaAs substrate 101, and consequently, the light intensity variation efficiency (dP/dI) can be restrained.

Therefore, reducing the light distribution in the n-type GaAs substrate 101 with this structure enables the improvement of kink level attributed to a variation in the longitudinal mode through the reduction in light resonance between the p-side electrode 112 and the n-side electrode 113, i.e., the restraint of the light intensity variation efficiency (dP/dI).

According to the above structure, the peak position of the laser light intensity distribution is shifted to the ridge side, and therefore, it is apprehended that the discontinuous refractive index of the ridge portion 109 might exert some influence. However, the layer thickness of the guide layers 106 and 107 located on the ridge side adjacent to the InGaAs active layer 105 is greater than that of the guide layers 103 and 104 located on the substrate side. Therefore, the laser light is hard to spread toward the ridge side, and the influence of the discontinuous refractive index of the ridge portion 109 is reduced to an ignorable level.

Figure 21:
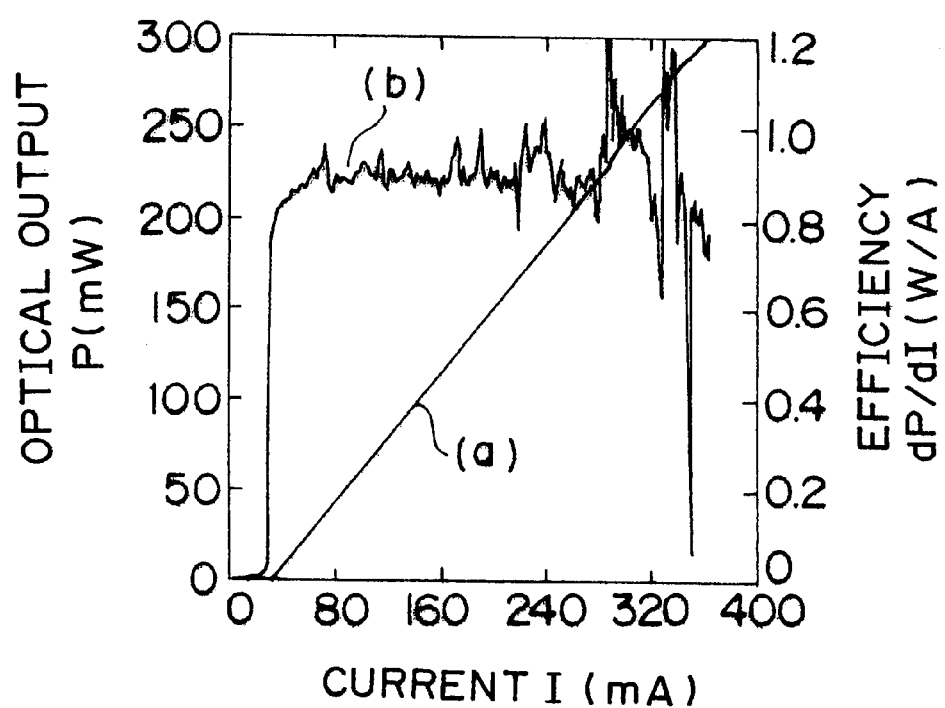
FIG. 21 is a graph of relations among a current, an optical output and efficiency.

FIG. 21 shows a current-to-optical output (P-I) characteristic and a current-to-efficiency (dP/dI-I) characteristic of the semiconductor laser 600 of FIG. 20. The horizontal axis represents the current (I), and the vertical axis represents the optical output (P) and the efficiency (dP/dI). The line (a) represents a relation between the current (I) and the optical output (P), while the line (b) represents a relation between the current (I) and the efficiency (dP/dI).

Figure 26:
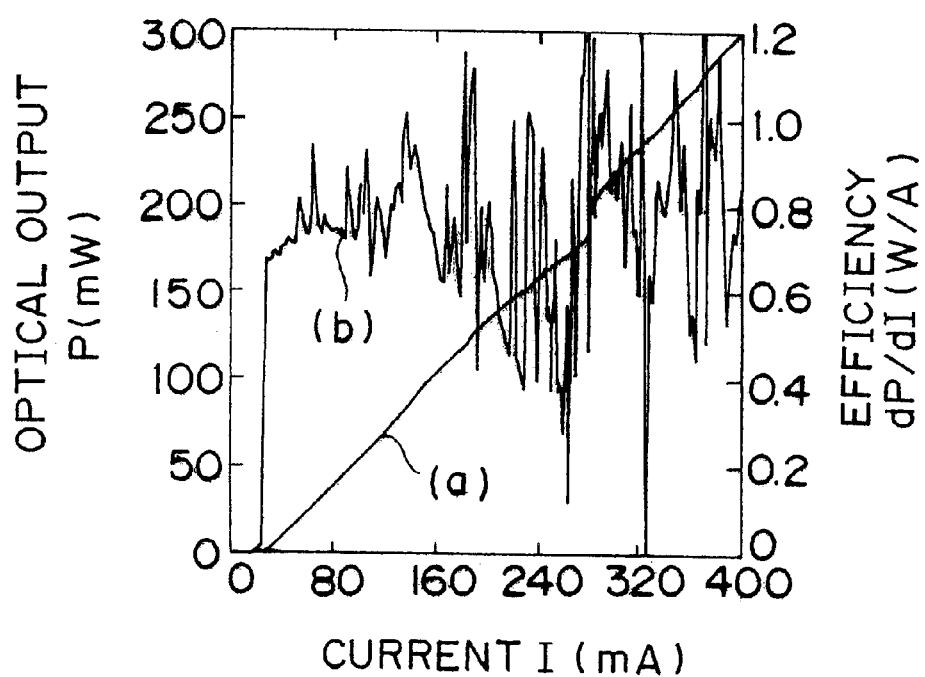
FIG. 26 is a graph of relations among a current, an optical output and efficiency.

It can be understood that the variation in the efficiency (dP/dI) is restrained further than in the conventional semiconductor laser of FIG. 26A and stabilized laser light can be obtained.

Although the layer thicknesses of both the undoped AlGaAs second guide layer 107 located on the ridge side and the undoped GaAs first guide layer 106 located on the ridge side are increased in FIG. 20A, a similar effect can be obtained merely by increasing the layer thickness of one of the layers.

If a graded index type guide layer in which the guide layer composition is continuously changed is employed, then a similar effect can be obtained by making the layer thickness of the guide layer located on the ridge side greater than the layer thickness of the guide layer located on the substrate side.

These effects can be obtained similarly in an eighth embodiment described later.

According to the structure of FIG. 20A, the refractive index of the n-type AlGaAs cladding layer 102 located on the GaAs substrate 101 side is made greater than the refractive index of a p-type AlGaAs cladding layer 111. Therefore, the aspect ratio ($\theta_V$ ($\theta$ in the x-axis direction)/$\theta_H$ ($\theta$ in the y-axis direction)) of the laser light can be improved, similarly to the invention described in JP, 11-233883, A. This arrangement can increase the kink caused by a modal change in the lateral mode of light intensity in terms of the current-to-light intensity characteristic and enables the obtainment of a stabilized light intensity.

By making the layer thickness of the n-type AlGaAs cladding layer 102 located on the GaAs substrate 1 side greater than the layer thickness of the p-type AlGaAs cladding layer 108 located on the ridge side, a distance between the InGaAs active layer 105 and the GaAs substrate 101 can be increased, allowing the light intensity distributed in the GaAs substrate 101 to be further restrained.

FIG. 25A shows the conventional semiconductor laser 170 as a second comparative example. The n-type AlGaAs cladding layer 102 laminated on the n-type GaAs substrate 101 has a refractive index $n_{1c}$ of 3.3550 and a layer thickness $d_{1c}$ of 1.8 µm.

The undoped AlGaAs second guide layer 103 located on the substrate side has a layer thickness $d_{lg2}$ of 50 nm and a refractive index of 3.406.

The undoped GaAs first guide layer 104 located on the substrate side has a layer thickness $d_{lg1}$ of 10 nm and a refractive index of 3.513.

The undoped InGaAs active layer 105 is constructed of a double-quantum well having a layer thickness of 8 nm, and a GaAs barrier layer having a thickness of 20 nm is included in the layer. The refractive index is 3.557.

Further, the undoped GaAs first guide layer 106 located on the ridge side has a layer thickness $d_{ug1}$ of 10 nm and a refractive index of 3.513.

The undoped AlGaAs second guide layer 107 located on the ridge side has a layer thickness $d_{ug2}$ of 50 nm and a refractive index of 3.406.

The p-type AlGaAs cladding layer 108 has a refractive index $n_{uc}$ of 3.343 and a layer thickness $d_{uc}$ of 1.5 µm.

As described above, according to the semiconductor laser 170 of FIG. 25A, the refractive indexes and the layer thicknesses of the first guide layers 104 and 106 and the second guide layers 103 and 107 become symmetrical with interposition of the InGaAs active layer 105.

According to the above structure, the light intensity is distributed roughly symmetrical about the active layer 105 in the x-axis direction, and therefore, the light intensity distribution included in the 0.5-µm thick layer 102' located on the GaAs substrate side becomes about 0.59% of the whole of the n-type AlGaAs cladding layer 102. This is about nine times that of the case of FIG. 20A.

SEVENTH EMBODIMENT

Figures 22A, 22B:
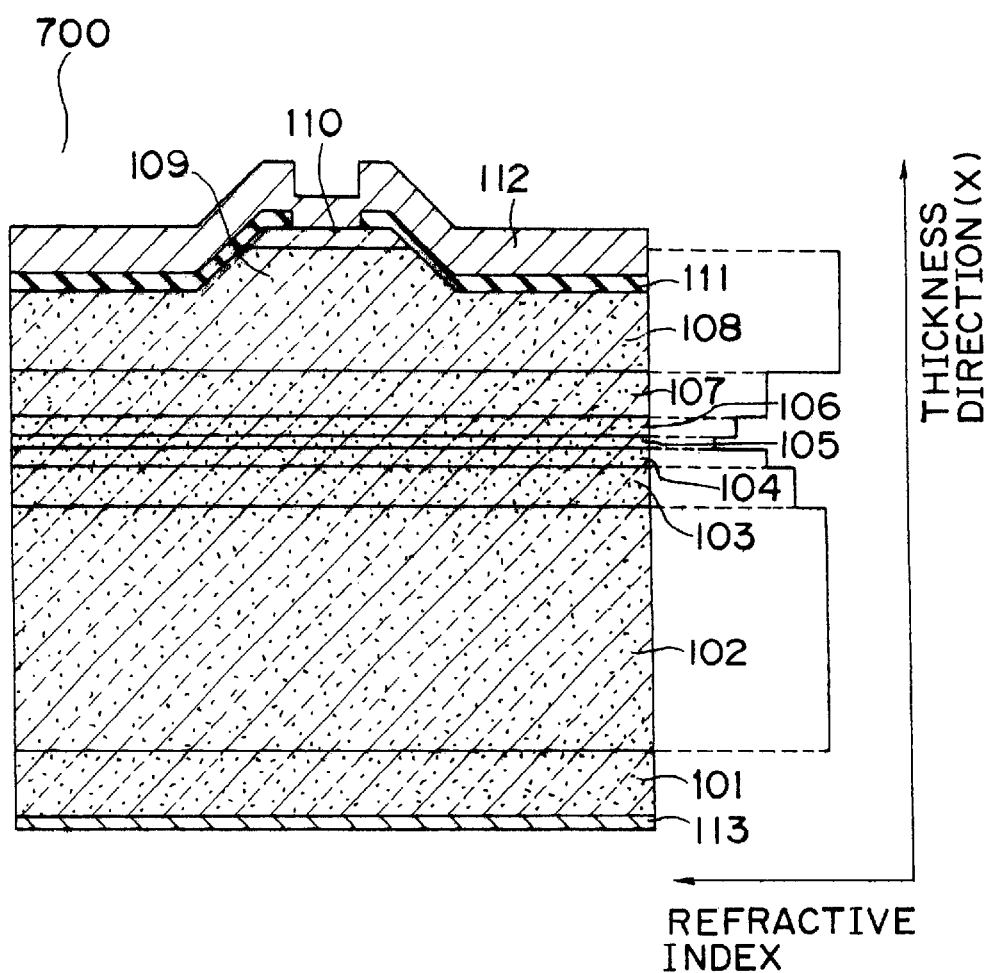
FIGS. 22A and 22B show a sectional view and a refractive index distribution, respectively, of a semiconductor laser according to a seventh embodiment of the present invention.

FIG. 22A shows a sectional view of a semiconductor laser according to the seventh embodiment of the present invention, while FIG. 22B shows a refractive index in the direction of thickness. In the figures, the portions denoted by the same reference numerals as used in FIG. 25A indicate identical or corresponding portions. The layer structure of the semiconductor laser 700 of the present embodiment is roughly identical to the layer structure of the semiconductor laser 170 of FIG. 25A. However, the present layer structure differs in that the refractive index of the guide layers 106 and 107 is made greater than the refractive index of the guide layers 103 and 104 in order to make the normalized frequency of the guide layers 106 and 107 located on the ridge side greater than the normalized frequency of the guide layers 103 and 104 located on the substrate side.

Specifically, the refractive index $n_{ug2}$ of the undoped AlGaAs second guide layer 107 located on the ridge side is set greater than the refractive index $n_{lg2}$ of the undoped AlGaAs second guide layer 103 located on the substrate side, while the refractive index $n_{ug1}$ of the undoped AlGaAs first guide layer 106 located on the ridge side is set greater than the refractive index $n_{lg1}$ of the undoped AlGaAs first guide layer 104 located on the substrate side.

With the above setting, as is understood from the equation 1, the normalized frequency of the guide layers 106 and 107 located on the ridge side can be made greater than the normalized frequency of the guide layers 103 and 104 located on the substrate side, as a consequence of which a similar effect as that of the aforementioned sixth embodiment can be obtained.

That is, by reducing the light distribution in the GaAs substrate 101 for the suppression of the resonance phenomenon occurring between the p-side electrode 112 and the n-side electrode 113, the kink level attributed to the variation in the longitudinal mode can be improved. With this arrangement, the variation in efficiency (dP/dI) can be reduced, and a stabilized optical output can be obtained.

Although the refractive indexes of both the undoped AlGaAs second guide layer 107 located on the ridge side and the undoped GaAs first guide layer 106 located on the ridge side are increased in the present embodiment, a similar effect can be obtained merely by increasing the refractive index of one of the layers.

If a graded index type guide layer in which the guide layer composition is continuously changed is employed, then it is proper to wholly make the refractive index of the guide layer located on the ridge side greater than the refractive index of the guide layer located on the substrate side.

These effects can be obtained similarly in a ninth embodiment described later.

EIGHTH EMBODIMENT

Figures 23A, 23B:
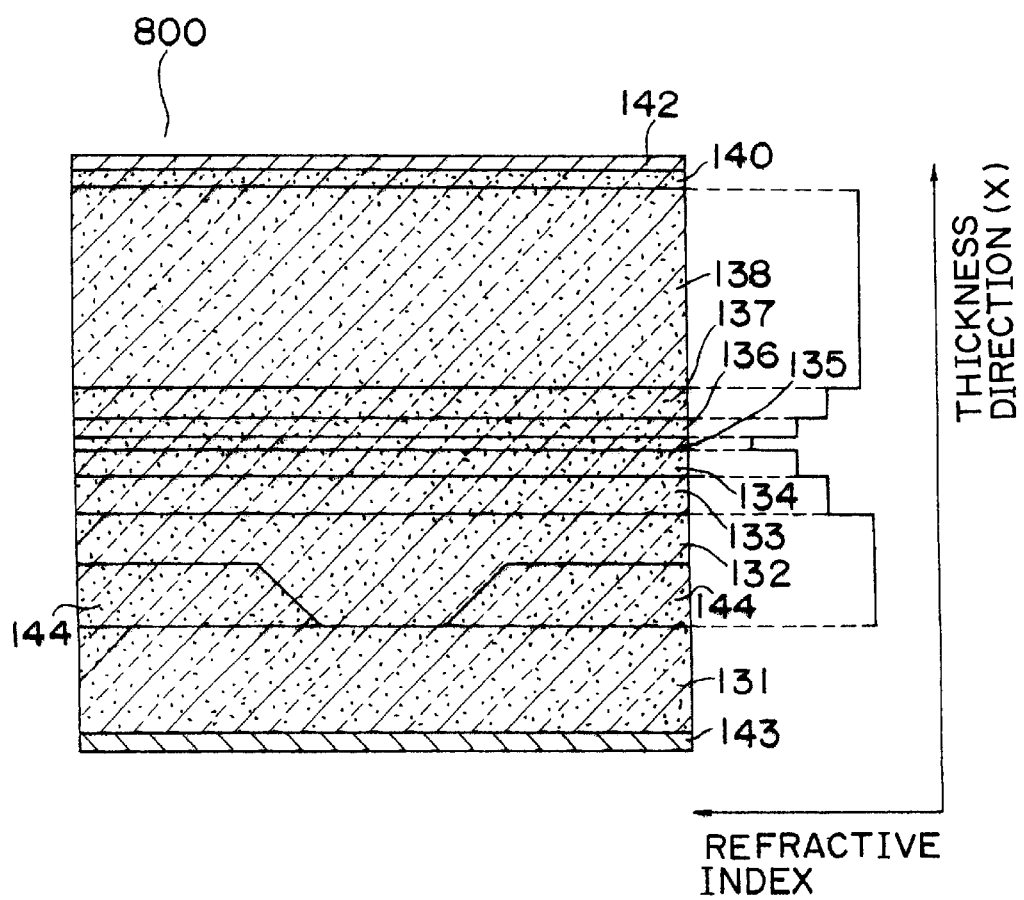
FIGS. 23A and 23B show a sectional view and a refractive index distribution, respectively, of a semiconductor laser according to an eighth embodiment of the present invention.

FIG. 23A shows a sectional view of a semiconductor laser according to the eighth embodiment of the present invention, while FIG. 23B shows a refractive index in the direction of thickness (x-axis direction).

The semiconductor laser 800 of the present embodiment has a structure in which a current block layer 144 is formed on a GaAs substrate 131 and an embedded type current constriction portion 139 is provided.

The layer thickness of guide layers 133 and 134 is designed so as to be greater than the layer thickness of guide layers 136 and 137 in order to make the normalized frequency of the guide layers 133 and 134 located on the current constriction portion 139 side greater than the normalized frequency of the guide layers 136 and 137 located on the surface side.

Specifically, according to the structure of FIG. 23A, an n-type AlGaAs cladding layer 132 laminated on the n-type GaAs substrate 131 has a refractive index $n_{1c}$ of 3.3550 and a layer thickness $d_{1c}$ of 2.5 μm. The cladding layer 132 is partially held in the current block layer 144 constructed of an n-type AlGaAs layer, defining the current constriction portion 139 in the space.

Further, an undoped AlGaAs second guide layer 133 laminated on the layers has a layer thickness $d_{lg2}$ of 50 nm and a refractive index of 3.406.

An undoped GaAs first guide layer 134 laminated on the layer has a layer thickness $d_{lg1}$ of 10 nm and a refractive index of 3.513.

An InGaAs active layer 135 laminated on the layer is constructed of double-quantum wells having a layer thickness of 8 nm and includes a GaAs barrier layer having a thickness of 20 nm in the layer. The refractive index is 3.557.

Further, an undoped GaAs first guide layer 136 located on the surface side has a layer thickness $d_{ug1}$ of 40 nm and a refractive index of 3.513.

An undoped AlGaAs second guide layer 137 laminated on the layer has a layer thickness $d_{ug2}$ of 30 nm and a refractive index of 3.406.

A p-type AlGaAs cladding layer 138 laminated on the layer has a refractive index $n_{uc}$ of 3.343 and a layer thickness $d_{uc}$ of 1.8 μm.

A p-type GaAs contact layer 140 is formed on the p-type AlGaAs cladding layer 138.

A p-side electrode 142 and an n-side electrode 143 are provided above the p-type GaAs contact layer 140 and below the GaAs substrate 131, respectively.

According to the above structure, light is distributed in the p-type GaAs contact layer 140 to maintain the vibration of the light, and this becomes a reason for the resonance between the p-side electrode 142 and the n-side electrode 143. Therefore, the guide layer is designed so as to reduce the light intensity distribution in the p-type GaAs contact layer 140.

Specifically, the light distribution in the p-type GaAs contact layer 140 is reduced by making the layer thickness of the guide layers 133 and 134 located on the substrate side greater than the layer thickness of the guide layers 136 and 137 located on the upper side for the shift of the light intensity peak position toward the substrate side.

This arrangement can suppress the resonance phenomenon occurring between the p-side electrode 112 and the n-side electrode 113 and improve the kink level attributed to the variation in the longitudinal mode, allowing a stabilized optical output to be obtained with a reduced variation in the efficiency (dP/dI).

According to the present embodiment, the layer thickness of the guide layers 133 and 134 located on the substrate side is greater than the layer thickness of the guide layers 136 and 137 located on the upper side, and therefore, the light distribution toward the substrate side is reduced. With this arrangement, the influence of the discontinuous refractive index in the current constriction portion 139 and the influence of the resonance caused by the distribution of light in the GaAs substrate 131 can be reduced to an ignorable level.

Furthermore, also in the structure having the embedded type current block layer 144 described above, the aspect ratio ($\theta_V$ (θ in the x-axis direction)/$\theta_H$ (η in the y-axis direction)) of the laser light can be increased by making the refractive index of the p-type AlGaAs cladding layer 138 located on the GaAs contact layer 140 side greater than the refractive index of the n-type AlGaAs cladding layer 132 located on the substrate side.

It is also possible to further restrain the light intensity distributed in the GaAs contact layer 140 with an increased distance between the InGaAs active layer 105 and the GaAs contact layer 140 by making the layer thickness of the p-type AlGaAs cladding layer 138 located on the GaAs contact layer 140 side greater than the layer thickness of the n-type AlGaAs cladding layer 132 located on the substrate side.

NINTH EMBODIMENT

Figures 24A, 24B:
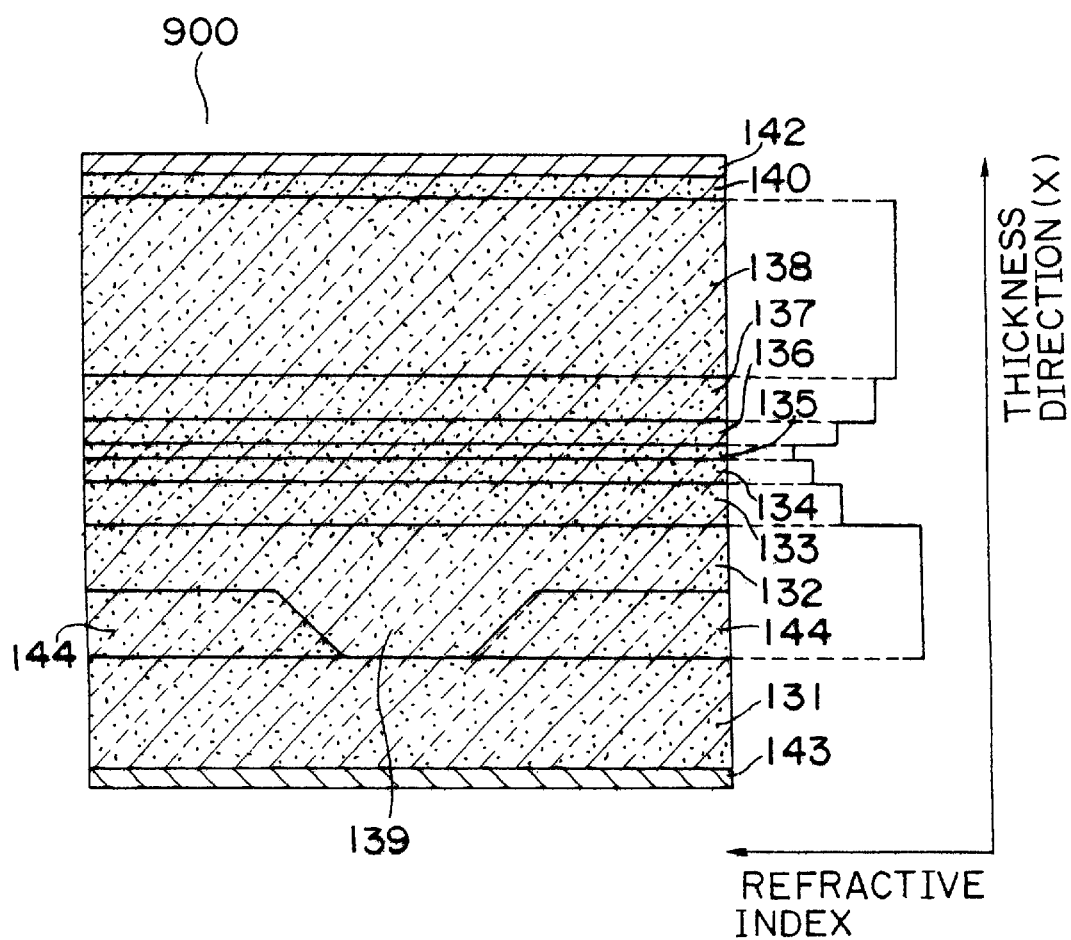
FIGS. 24A and 24B show a sectional view and a refractive index distribution, respectively, of a semiconductor laser according to a ninth embodiment of the present invention.

FIG. 24A shows a sectional view of a semiconductor laser according to the ninth embodiment of the present invention, while FIG. 24B shows a refractive index in the direction of thickness (x-axis direction). In the figures, the portions denoted by the same reference numerals as used in FIG. 23A indicate identical or corresponding portions. The layer structure of the semiconductor laser 900 of the present embodiment is roughly identical to the layer structure of the semiconductor laser 800 of FIG. 23A, in which a current block layer 144 is formed on a GaAs substrate 131 and an embedded type current constriction portion 139 is provided.

According to the semiconductor laser 900 of the present embodiment, dissimilar to the semiconductor laser 800 of FIG. 23A, the refractive index of the guide layers 133 and 134 is designed to be greater than the refractive index of the guide layers 136 and 137 in order to make the normalized frequency of the guide layers 133 and 134 located on the current constriction portion 139 side greater than the normalized frequency of the guide layers 136 and 137 located on the surface side.

Specifically, the distribution of light in the p-type GaAs contact layer 140 is reduced by making the refractive index of the guide layers 133 and 134 located on the substrate side greater than the refractive index of the guide layers 136 and 137 located on the upper side for the shift of the light intensity peak position toward the substrate side.

This arrangement can suppress the resonance phenomenon occurring between the p-side electrode 112 and the n-side electrode 113 and improve the kink level attributed to the variation in the longitudinal mode, allowing a stabilized optical output to be obtained with a reduced variation in the efficiency (dP/dI).

According to the present embodiment, the refractive index of the guide layers 133 and 134 located on the substrate side is greater than the refractive index of the guide layers 136 and 137 located on the upper side, and therefore, the light distribution toward the substrate side is reduced. With this arrangement, the influence of the discontinuous refractive index in the current constriction portion 139 and the influence of the resonance caused by the distribution of light in the GaAs substrate 131 can be reduced to an ignorable level.

Also, in the structure having the embedded type current block layer 144 described above, the aspect ratio ($\theta_V$ ($\theta$ in the x-axis direction)/$\theta_H$ ($\theta$ in the y-axis direction)) of the laser light can be improved by making the refractive index of the p-type AlGaAs cladding layer 138 located on the GaAs contact layer 140 side greater than the refractive index of the n-type AlGaAs cladding layer 132 located on the substrate side.

It is also possible to further restrain the light intensity distributed in the GaAs contact layer 140 with an increased distance between the InGaAs active layer 105 and the GaAs contact layer 140 by making the layer thickness of the p-type AlGaAs cladding layer 138 located on the GaAs contact layer 140 side greater than the layer thickness of the n-type AlGaAs cladding layer 132 located on the substrate side.

As is apparent from the aforementioned description, according to the semiconductor laser of the present invention, the aspect ratio of the laser light can be reduced and the kink caused by the change in the lateral mode of light intensity can be increased in terms of the current-to-light intensity characteristic. This enables the obtainment of a semiconductor laser of a stabilized light intensity.

Furthermore, a semiconductor laser in which the kink level of transition from light emission in the fundamental mode to light emission in the first order mode is increased and the variation in the optical output efficiency (dP/dI) is small can be obtained.

Furthermore, a semiconductor laser that prevents the increase in the threshold current and the reduction in the optical output efficiency (dP/dI) at an elevated temperature can be obtained.

Furthermore, a semiconductor laser that has a stabilized optical output with a reduced vibration of light occurring between the electrodes and an ability to reduce the variation in the optical output efficiency (dP/dI) relative to the variation in current in terms of the current-to-optical output characteristic can be obtained.

What is claimed is:

1. A semiconductor laser comprising:
   a semiconductor substrate; and
   a laminated structure on the semiconductor substrate and including:
     an active layer having first and second sides;
     a first guide layer having a refractive index and laminated on the first side of the active layer;
     a first cladding layer having a refractive index, laminated on the first guide layer, and including a current constriction portion;
     a second guide layer having a refractive index smaller than the refractive index of the first guide layer and laminated on the second side of the active layer; and
     a second cladding layer laminated on the second guide layer and having a refractive index higher than the refractive index of the first cladding layer, so that light emitted by the semiconductor laser has an intensity distribution having a maximum intensity aligned with the active layer.

2. The semiconductor laser according to claim 1, wherein the first guide layer is thicker than the second guide layer.

3. The semiconductor laser according to claim 1, wherein the first guide layer has a larger band gap energy than the second guide layer.

4. The semiconductor laser according to claim 1, wherein the second cladding layer is arranged between the substrate and the active layer, and the second cladding layer is thicker than the first cladding layer.

5. A semiconductor laser comprising:
   a GaAs substrate; and
   a laminated structure disposed on the GaAs substrate and including:
     an $In_xGa_{1-x}As$ ($0<x<0.3$) active layer having first and second sides;
     a first guide layer laminated on the first side of the active layer;
     a first cladding layer laminated on the first guide layer and including a current constriction portion; and
     a second guide layer and a second cladding layer laminated in order on the second side of the active layer, wherein a normalized frequency of the first guide layer is higher than a normalized frequency of the second guide layer.

6. The semiconductor laser according to claim 5, wherein the first cladding layer is located on the side of the active layer opposite from the GaAs substrate.

7. The semiconductor laser according to claim 5, wherein the first cladding layer is located on the same side of the active layer as the GaAs substrate and including a GaAs contact layer laminated on the second cladding layer.

8. The semiconductor laser according to claim 5, wherein the first guide layer is thicker than the second guide layer.

9. The semiconductor laser according to claim 5, wherein the first guide layer has a larger refractive index than the second guide layer.

10. The semiconductor laser according to claim 5, wherein the second cladding layer has a larger refractive index than the first cladding layer.

11. The semiconductor laser according to claim 10, wherein the the second cladding layer is thicker than the first cladding layer.

12. The semiconductor laser according to claim 1, including a low refractive index layer having a refractive index lower than the refractive indexes of the first and second cladding layers and disposed between the first guide layer and the first cladding layer.

13. The semiconductor laser according to claim 12, wherein the active layer and the first and second guide layers have a total thickness not less than about 15 percent of an oscillation wavelength of the semiconductor laser.

14. The semiconductor laser according to claim 13, wherein the total thickness of the active layer and the first and second guide layers is about 18 percent of the oscillation wavelength of the semiconductor laser.

15. The semiconductor laser according to claim 1, including a low refractive index layer having a refractive index lower than the refractive indexes of the first and second cladding layers and disposed between the second guide layer and the second cladding layer.

16. The semiconductor laser according to claim 15, wherein the active layer and the first and second guide layers have a total thickness not less than about 15 percent of an oscillation wavelength of the semiconductor laser.

17. The semiconductor laser according to claim 16, wherein the total thickness of the active layer and the first and second guide layers is about 18 percent of the oscillation wavelength of the semiconductor laser.

18. The semiconductor laser according to claim 1, including a pair of low refractive index layers having a refractive index lower than the refractive indexes of the first and second cladding layers, a first of the low refractive index layers being interposed between the first guide layer and the first cladding layer and a second of the low refractive index layers being disposed between the second guide layer and the second cladding layer.

19. The semiconductor laser according to claim 18, wherein the active layer and the first and second guide layers have a total thickness not less than about 15 percent of an oscillation wavelength of the semiconductor laser.

20. The semiconductor laser according to claim 19, wherein the total thickness of the active layer and the first and second guide layers is about 18 percent of the oscillation wavelength of the semiconductor laser.

* * * * *